US012690123B2

(12) United States Patent
Kim et al.

(10) Patent No.: US 12,690,123 B2
(45) Date of Patent: Jul. 21, 2026

(54) DISPLAY MODULE ACCOUNTING FOR ESD PHENOMENON, AND ELECTRONIC DEVICE COMPRISING DISPLAY MODULE

(71) Applicant: Samsung Electronics Co., Ltd., Suwon-si (KR)

(72) Inventors: Jonghae Kim, Suwon-si (KR); Hunjo Jung, Suwon-si (KR); Sangryeol Cha, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 343 days.

(21) Appl. No.: 18/470,805

(22) Filed: Sep. 20, 2023

(65) Prior Publication Data

US 2024/0023233 A1     Jan. 18, 2024

Related U.S. Application Data

(63) Continuation of application No. PCT/KR2022/004594, filed on Mar. 31, 2022.

(30) Foreign Application Priority Data

Apr. 5, 2021     (KR) ........................ 10-2021-0043919

(51) Int. Cl.
*H05K 1/02*          (2006.01)

(52) U.S. Cl.
CPC .......... *H05K 1/0259* (2013.01); *H05K 1/028* (2013.01); *H05K 2201/0723* (2013.01); *H05K 2201/10128* (2013.01)

(58) Field of Classification Search
CPC ................. H05K 1/0259; H05K 1/028; H05K 2201/0723; H05K 2201/10128
(Continued)

(56) References Cited

U.S. PATENT DOCUMENTS 5,967,799 A * 10/1999 Arai ..................... H01R 12/775
                                                                          439/108
7,859,633 B2    12/2010 Park
(Continued)

FOREIGN PATENT DOCUMENTS

CN          102073160 A      5/2011
JP          1999-224790 A    8/1999
(Continued)

OTHER PUBLICATIONS

Korean Office Action dated Jun. 10, 2025, issued in Korean Patent Application No. 10-2021-0043919.
(Continued)

*Primary Examiner* — Binh B Tran
(74) *Attorney, Agent, or Firm* — Jefferson IP Law, LLP

(57)          ABSTRACT

An electronic device is provided. The electronic device includes a display panel, a flexible printed circuit board electrically connected to the display panel, a first connection part disposed on the flexible printed circuit board, at least one electronic component disposed on the flexible printed circuit board so as to be adjacent to the first connection part, and a connecting member including a second connection part that is coupled to the first connection part so as to be electrically connected to the flexible printed circuit board. The connecting member includes an extension part that is formed so as to cover the at least one electronic component disposed on the flexible printed circuit board.

20 Claims, 20 Drawing Sheets

(58) Field of Classification Search
USPC ........................................................ 361/749
See application file for complete search history.

(56)                References Cited

U.S. PATENT DOCUMENTS

| | | | |
|---|---|---|---|
| 8,320,097 | B2 | 11/2012 | Lin et al. |
| 9,532,491 | B2 | 12/2016 | Hashido |
| 9,877,382 | B2 | 1/2018 | Lee |
| 10,031,553 | B2 | 7/2018 | Yang |
| 2010/0273539 | A1 | 10/2010 | Lee et al. |
| 2014/0240933 | A1* | 8/2014 | Lee ....................... G06F 1/1656 |
| | | | 29/831 |
| 2017/0170255 | A1* | 6/2017 | Ha ....................... H10K 59/131 |
| 2020/0371558 | A1 | 11/2020 | Kim et al. |

FOREIGN PATENT DOCUMENTS

| | | | |
|---|---|---|---|
| JP | 2003-167263 | A | 6/2003 |
| JP | 2008-078386 | A | 4/2008 |
| JP | 2009-192976 | A | 8/2009 |
| KR | 10-0256284 | B1 | 5/2000 |
| KR | 10-2006-0023623 | A | 3/2006 |
| KR | 10-2008-0043051 | A | 5/2008 |
| KR | 10-2010-0116321 | A | 11/2010 |
| KR | 10-2019-0086305 | A | 7/2019 |
| KR | 10-2020982 | B1 | 9/2019 |
| KR | 10-2181550 | B1 | 11/2020 |

OTHER PUBLICATIONS

International Search Report with Written Opinion and English translation dated Jun. 28, 2022; International Appln. No. PCT/KR2022/004594.

* cited by examiner (a)

(b)

(a)

(b)

(a)

(b)

DISPLAY MODULE ACCOUNTING FOR ESD PHENOMENON, AND ELECTRONIC DEVICE COMPRISING DISPLAY MODULE

CROSS-REFERENCE TO RELATED APPLICATION(S)

This application is a continuation application, claiming priority under § 365(c), of an International application No. PCT/KR2022/004594, filed on Mar. 31, 2022, which is based on and claims the benefit of a Korean patent application number 10-2021-0043919, filed on Apr. 5, 2021, in the Korean Intellectual Property Office, the disclosure of which is incorporated by reference herein in its entirety.

BACKGROUND

1. Field

The disclosure relates to a display module having a structure capable of preventing an electro static discharge (ESD) phenomenon and an electronic device including the display module.

2. Description of Related Art

Electronic devices are gradually being formed in a small size, and various electronic components included in the electronic devices are being integrated. More particularly, a portable electronic device may have a smaller internal space in consideration of portability.

Due to these restrictions, a distance between electronic components included in the electronic device and electrical objects including conductive materials is also decreasing.

In this way, when a separation distance between electrical objects is reduced, various problems may occur. Although a method of disposing instruments of an insulating material between electrical objects may be used, exposed electrical objects may exist according to space restrictions and connection relationships.

The above information is presented as background information only to assist with an understanding of the disclosure. No determination has been made, and no assertion is made, as to whether any of the above might be applicable as prior art with regard to the disclosure.

SUMMARY

Electro static discharge (ESD) is an electrical phenomenon that occurs when accumulated electric charges by various factors move instantaneously to other parts.

An electronic device includes various electronic components and electrical objects including conductive materials. Accumulation of electric charges occurs during an operation of these electronic components and electric objects. An ESD phenomenon occurs due to accumulated electric charges.

Because ESD accompanies a strong voltage, when an ESD phenomenon occurs in an electronic component, the electronic component is damaged. Due to such damage, various problems, such as malfunction of the electronic device or deterioration in performance occurs.

Aspects of the disclosure are to address at least the above-mentioned problems and/or disadvantages and to provide at least the advantages described below. Accordingly, an aspect of the disclosure is to provide a display module constituted in consideration of an ESD phenomenon and an electronic device including the display module.

Additional aspects will be set forth in part in the description which follows and, in part, will be apparent from the description, or may be learned by practice of the presented embodiments.

In accordance with an aspect of the disclosure, an electronic device is provided. The electronic device includes a display panel, a flexible printed circuit board electrically connected to the display panel, a first connection part disposed at the flexible printed circuit board, at least one electronic component disposed on the flexible printed circuit board adjacent to the first connection part, and a connecting member including a second connection part coupled to the first connection part to be electrically connected to the flexible printed circuit board, wherein the connecting member includes an extension part formed to cover at least one electronic component disposed at the flexible printed circuit board.

In accordance with another aspect of the disclosure, a display module is provided. The display module includes a display panel, a flexible printed circuit board electrically connected to the display panel, a first connection part disposed at the flexible printed circuit board, at least one electronic component disposed on the flexible printed circuit board adjacent to the first connection part, and a connecting member including a second connection part coupled to the first connection part to be electrically connected to the flexible printed circuit board, wherein the connecting member includes an extension part formed to cover at least one electronic component disposed at the flexible printed circuit board.

According to various embodiments of the disclosure, because an ESD phenomenon that may occur in electronic components may be reduced, damage of electronic components due to the ESD phenomenon can be prevented. In addition to this, various effects identified directly or indirectly through this document can be provided.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

As used herein, each of such phrases as "A or B", "at least one of A and B", "at least one of A or B", "A, B, or C", "at least one of A, B, and C", and "at least one of A, B, or C" may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order).

It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

Figure 1:
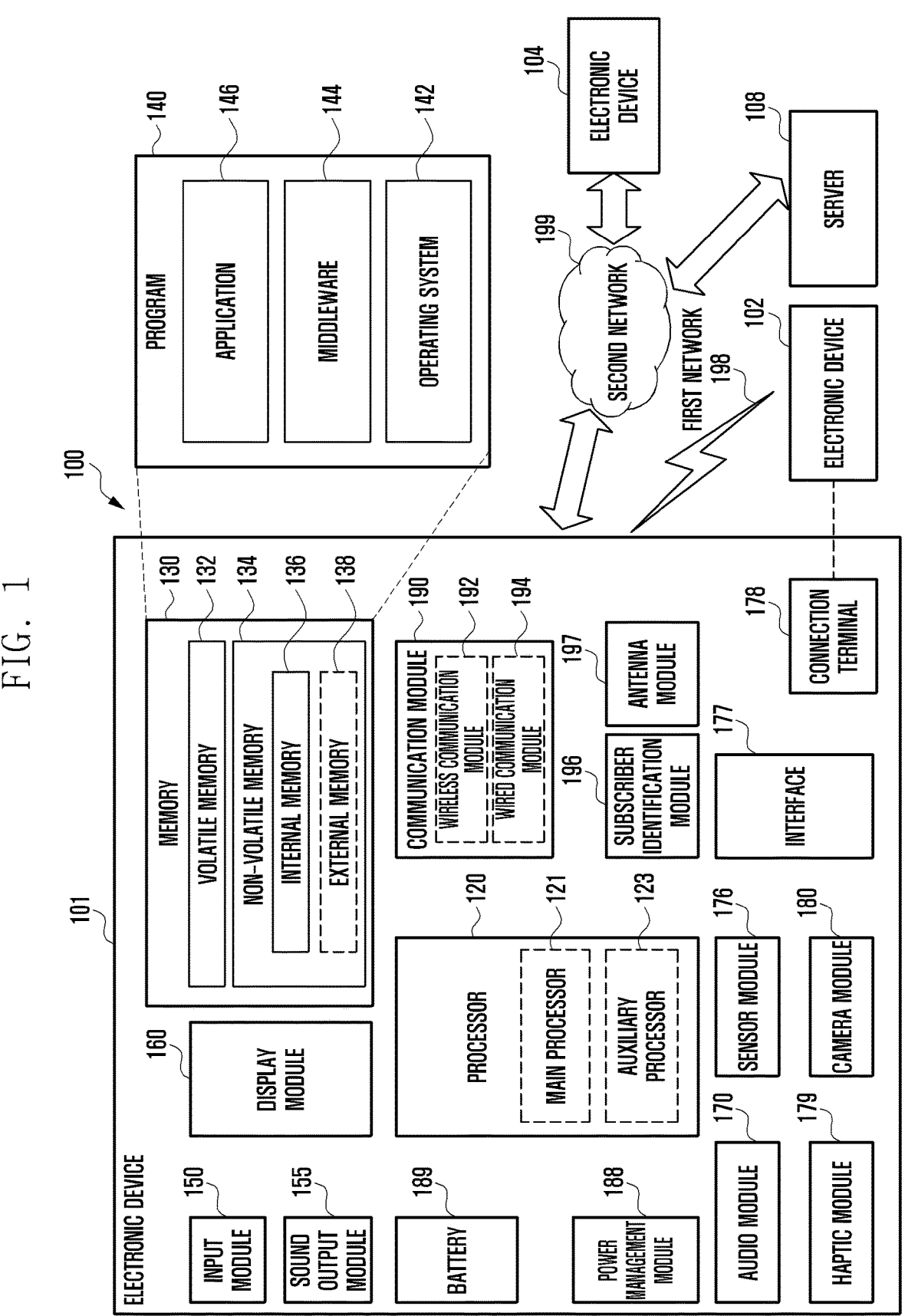
FIG. 1 is a block diagram illustrating an electronic device in a network environment according to an embodiment of the disclosure.

FIG. 1 is a block diagram illustrating an electronic device in a network environment according to an embodiment of the disclosure.

Referring to FIG. 1, an electronic device 101 in a network environment 100 may communicate with an external electronic device 102 via a first network 198 (e.g., a short-range wireless communication network), or at least one of an external electronic device 104 or a server 108 via a second network 199 (e.g., a long-range wireless communication network). According to an embodiment of the disclosure, the electronic device 101 may communicate with the external electronic device 104 via the server 108. According to an embodiment of the disclosure, the electronic device 101 may include a processor 120, a memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments of the disclosure, at least one of the components (e.g., the connecting terminal 178) may be omitted from the electronic device 101, or one or more other components may be added in the electronic device 101. In some embodiments of the disclosure, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment of the disclosure, as at least part of the data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to an embodiment of the disclosure, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., a sleep) state, or together with the main processor 121 while the main processor 121 is in an active state (e.g., executing an application). According to an embodiment of the disclosure, the auxiliary processor 123 (e.g., an image signal processor or a communication processor) may be implemented as part of another component (e.g., the camera module 180 or the communication module 190) functionally related to the auxiliary processor 123. According to an embodiment of the disclosure, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The non-volatile memory 134 may include an internal memory 136 and an external memory 138.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment of the disclosure, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment of the disclosure, the display module 160 may include a touch sensor adapted to detect a touch, or a pressure sensor adapted to measure the intensity of force incurred by the touch.

The audio module 170 may convert a sound into an electrical signal and vice versa. According to an embodiment of the disclosure, the audio module 170 may obtain the sound via the input module 150, or output the sound via the sound output module 155 or a headphone of an external electronic device (e.g., the external electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment of the disclosure, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the external electronic device 102) directly (e.g., wiredly) or wirelessly. According to an embodiment of the disclosure, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the external electronic device 102). According to an embodiment of the disclosure, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment of the disclosure, the haptic module 179 may include, for example, a motor, a piezoelectric element, or an electric stimulator.

The camera module 180 may capture a still image or moving images. According to an embodiment of the disclosure, the camera module 180 may include one or more lenses, image sensors, image signal processors, or flashes.

The power management module 188 may manage power supplied to the electronic device 101. According to one embodiment of the disclosure, the power management module 188 may be implemented as at least part of, for example, a power management integrated circuit (PMIC).

The battery 189 may supply power to at least one component of the electronic device 101. According to an embodiment of the disclosure, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the external electronic device 102, the external electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment of the disclosure, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a fifth generation (5G) network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a fourth generation (4G) network, and next-generation communication technology, e.g., new radio (NR) access technology. The NR access technology may support enhanced mobile broadband (eMBB), massive machine type communications (mMIC), or ultra-reliable and low-latency communications (URLLC). The wireless communication module 192 may support a high-frequency band (e.g., the millimeter (mm) Wave band) to achieve, e.g., a high data transmission rate. The wireless communication module 192 may support various technologies for securing performance on a high-frequency band, such as, e.g., beam-forming, massive multiple-input and multiple-output (massive MIMO), full dimensional MIMO (FD-MIMO) array antenna, analog beam-forming, or large scale antenna. The wireless communication module 192 may support various requirements specified in the electronic device 101, an external electronic device (e.g., the external electronic device 104), or a network system (e.g., the second network 199). According to an embodiment of the disclosure, the wireless communication module 192 may support a peak data rate (e.g., 20 gigabits per second (Gbps) or more) for implementing eMBB loss coverage (e.g., 164 dB or less) for implementing mMTC, or U-plane latency (e.g., 0.5 ms or less for each of downlink (DL) and uplink (UL), a round trip of 1 ms or less) for implementing URLLC.

The antenna module 197 may transmit or receive a signal or power to or from the outside (e.g., the external electronic device) of the electronic device 101. According to an embodiment of the disclosure, the antenna module 197 may include an antenna including a radiating element including a conductive material or a conductive pattern formed in or on a substrate (e.g., a printed circuit board (PCB)). According to an embodiment of the disclosure, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment of the disclosure, another component (e.g., a radio frequency integrated circuit (RHO) other than the radiating element may be additionally formed as part of the antenna module 197.

According to various embodiments of the disclosure, the antenna module 197 may form a millimeter wave (mm-Wave) antenna module. According to an embodiment of the disclosure, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment of the disclosure, commands or data may be transmitted or received between the electronic device 101 and the external electronic device 104 via the server 108 coupled with the second network 199. Each of the external electronic devices 102 or 104 may be a device of a same type as, or a different type, from the electronic device 101. According to an embodiment of the disclosure, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment of the disclosure, the external electronic device 104 may include an internet-of-things (IoT) device. The server 108 may be an intelligent server using machine learning and/or a neural network. According to an embodiment of the disclosure, the external electronic device 104 or the server 108 may be included in the second network 199. The electronic device 101 may be applied to intelligent services (e.g., a smart home, a smart city, a smart car, or healthcare) based on 5G communication technology or IoT-related technology.

Figure 2A:
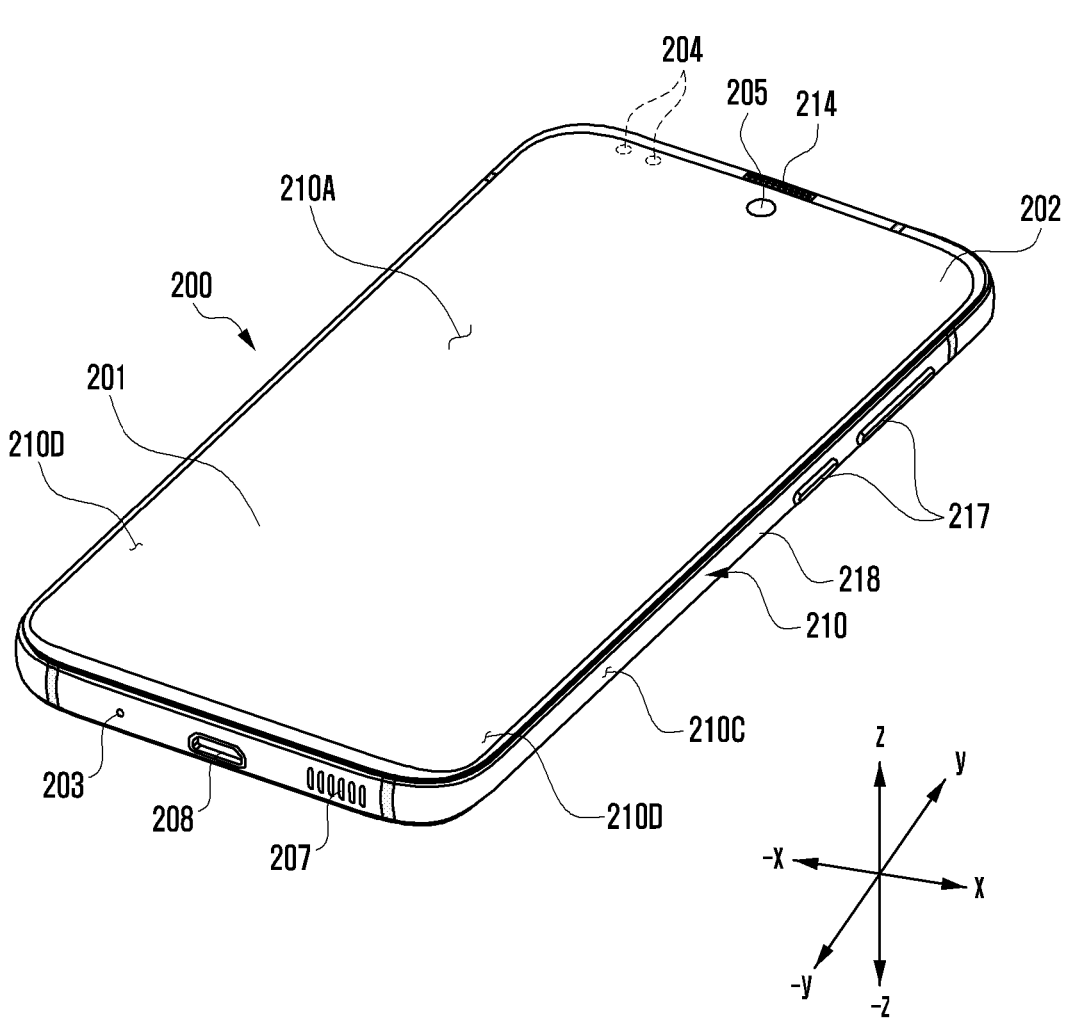
FIG. 2A is a perspective view illustrating a front surface of an electronic device according to an embodiment of the disclosure.

FIG. 2A is a front perspective view of an electronic device 200 according to an embodiment of the disclosure of the disclosure.

Figure 2B:
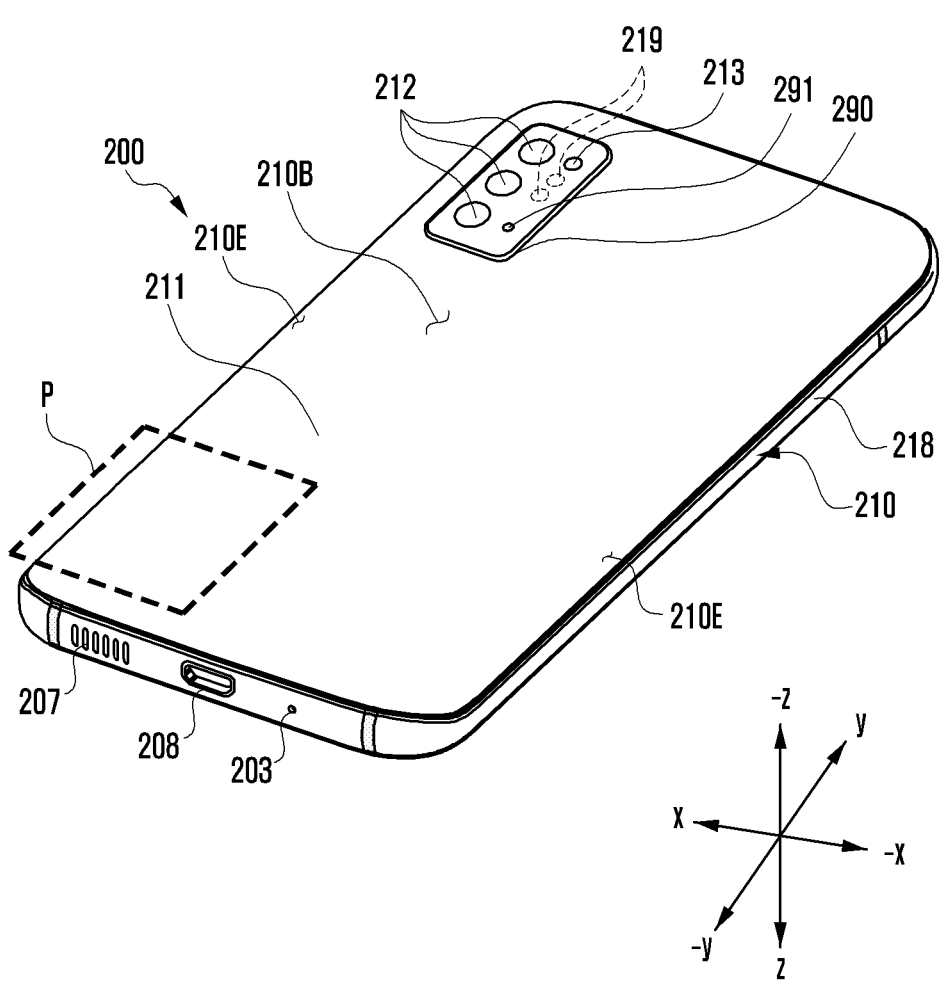
FIG. 2B is a perspective view illustrating a rear surface of an electronic device of FIG. 2A according to an embodiment of the disclosure.

FIG. 2B is a rear perspective view of an electronic device 200 in FIG. 2A according to an embodiment of the disclosure.

The electronic device 200 to be described hereinbelow may include at least one of the elements of the electronic device 101 previously described in FIG. 1.

Referring to FIGS. 2A and 2B, the mobile electronic device 200 may include a housing 210 that includes a first surface (or front surface) 210A, a second surface (or rear surface) 210B, and a lateral surface 210C that surrounds a space between the first surface 210A and the second surface 210B. The housing 210 may refer to a structure that forms a part of the first surface 210A, the second surface 210B, and the lateral surface 2100. The first surface 210A may be formed of a front plate 202 (e.g., a glass plate or polymer plate coated with a variety of coating layers) at least a part of which is substantially transparent. The second surface 210B may be formed of a rear plate 211 which is substantially opaque. The rear plate 211 may be formed of, for example, coated or colored glass, ceramic, polymer, metal (e.g., aluminum, stainless steel (STS), or magnesium), or any combination thereof. The lateral surface 210C may be formed of a lateral bezel structure (or "lateral member") 218 which is combined with the front plate 202 and the rear plate 21:1 and includes a metal and/or polymer. The rear plate 211 and the lateral bezel structure 218 may be integrally formed and may be of the same material (e.g., a metallic material, such as aluminum).

The front plate 202 may include two first regions 210D disposed at long edges thereof, respectively, and bent and extended seamlessly from the first surface 210A toward the rear plate 211. Similarly, the rear plate 211 may include two second regions 210E disposed at long edges thereof, respectively, and bent and extended seamlessly from the second surface 210B toward the front plate 202. The front plate 202 (or the rear plate 211) may include only one of the first regions 210D (or of the second regions 210E). The first regions 210D or the second regions 210E may be omitted in part. When viewed from a lateral side of the mobile electronic device 200, the lateral bezel structure 218 may have a first thickness (or width) on a lateral side where the first region 210D or the second region 210E is not included, and may have a second thickness, being less than the first thickness, on another lateral side where the first region 210D or the second region 210E is included.

The mobile electronic device 200 may include at least one of a display 201, an input device 203, audio modules 207 and 214, sensor modules 204 and 219, camera modules 205 and 212, a key input device 217, indicator, and connector holes 208. The mobile electronic device 200 may omit at least one (e.g., the key input device 217 or the indicator) of the above components, or may further include other components.

The display 201 may be exposed through a substantial portion of the front plate 202, for example. At least a part of the display 201 may be exposed through the front plate 202 that forms the first surface 210A and the first region 210D of the lateral surface 210C. The display 201 may be combined with, or adjacent to, a touch sensing circuit, a pressure sensor capable of measuring the touch strength (pressure), and/or a digitizer for detecting a stylus pen. At least a part of the sensor modules 204 and 219 and/or at least a part of the key input device 217 may be disposed in the first region 210D and/or the second region 210E.

The input device 203 may include at least one microphone. In certain embodiments of the disclosure, the input device 203 may include a plurality of microphones disposed to detect the direction of a sound. The sound output devices 207 and 214 may include speakers 207 and 214. The speakers 207 and 214 may include an external speaker 207 and a receiver for calls 214. In certain embodiments of the disclosure, the input device 203, which may include at least one microphone, the sound output devices 207 and 214 and the connector port 208 may be disposed at least partially in the internal space of the electronic device 200, and may be exposed to the external environment through at least one hole formed in the housing 210. In certain embodiments of the disclosure, the hole formed in the housing 210 may be commonly used for the input device 203 and the speakers 207 and 214. In certain embodiments of the disclosure, the sound output devices 207 and 214 may include a speaker (e.g., a piezo speaker) that operates without using a hole formed in the housing 210. In an embodiment of the disclosure, a speaker (not illustrated) or a microphone (not illustrated) may be disposed at a position adjacent to the camera module 212. Sound output from the speaker disposed adjacent to the camera module 212 may be radiated to the outside through a hole 291 formed in a camera housing 290 disposed to cover the camera module 2:1.2. Alternatively, sound introduced through the hole 291 may be transferred to the microphone disposed adjacent to the camera module 212.

The sensor modules 204 and 219 may generate electrical signals or data corresponding to an internal operating state of the mobile electronic device 200 or to an external environmental condition. The sensor modules 204 and 219 may include a first sensor module 204 (e.g., a proximity sensor) and/or a second sensor module (e.g., a fingerprint sensor) disposed on the first surface 210A of the housing 210, and/or a third sensor module 219 (e.g., a heart rate monitor (HRM) sensor) and/or a fourth sensor module (e.g., a fingerprint sensor) disposed on the second surface 210B of the housing 210. The fingerprint sensor may be disposed on the second surface 210B as well as the first surface 210A (e.g., the display 201) of the housing 210. The electronic device 200 may further include at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 205 and 212 may include a first camera device 205 disposed on the first surface 210A of the electronic device 200, and a second camera device 2:12 and/or a flash 2:13 disposed on the second surface 210B. The first camera device 205 or the second camera device 212 may include one or more lenses, an image sensor, and/or an image signal processor. The flash 213 may include, for example, a light emitting diode or a xenon lamp, Two or more lenses (infrared cameras, wide angle and telephoto lenses) and image sensors may be disposed on one side of the electronic device 200. In an embodiment of the disclosure, the electronic device 200 may include a camera housing 290 disposed to cover the second camera device 212. At least a portion of the camera housing 290 may be made of a transparent material or the camera housing 290 may include a member made of a transparent material so that external light may be transferred to the second camera device 212.

The key input device 217 may be disposed on the lateral surface 210C of the housing 210. The mobile electronic device 200 may not include some or all of the key input device 217 described above, and the key input device 217 which is not included may be implemented in another form, such as a soft key on the display 201. In another embodiment of the disclosure, the key input device 217 may be implemented using a pressure sensor included in the display 201

The indicator may be disposed on the first surface 210A of the housing 210. For example, the indicator may provide status information of the electronic device 200 in an optical form. In another embodiment of the disclosure, the indicator may provide a light source associated with the operation of the first camera device 205. The light indicator may include, for example, a light emitting diode (LED), an IR LED, or a xenon lamp.

The connector holes 208 may include a first connector hole 208 adapted for a connector (e.g., a USB connector) for transmitting and receiving power and/or data to and from an external electronic device, and/or a second connector hole adapted for a connector (e.g., an earphone jack) for transmitting and receiving an audio signal to and from an external electronic device.

Some camera modules of camera modules 205 and 212, some sensor modules of sensor modules 204 and 219, or an indicator may be arranged to be exposed through the display 201. For example, the first camera device 205, the sensor module 204, or the indicator may be arranged in the internal space of an electronic device 200 so as to be brought into contact with an external environment through an opening of the display 201, which is perforated up to a front plate 202. According to an embodiment of the disclosure, an area corresponding to the first camera device 205 of the display 201 is a part of an area in which content is displayed, and may be formed as a transmission area having designated transmittance. According to an embodiment of the disclosure, a transmissive area may be formed to have a transmittance in a range of about 5% to about 25%. In one embodiment of the disclosure, the transmissive area may be formed to have a transmittance ranging from about 25% to about 50%. The transmission area may include an area overlapped with a valid area (e.g., a field of view (FOV)) of the first camera device 205 through which light imaged by an image sensor and for generating an image passes. For example, a transmission area of the display 201 may include an area in which the density of pixels and/or a wiring density are lower than that of surroundings. In some embodiments of the disclosure, the transmissive area may be an area in which light transmittance is increased by differently disposing wirings or driving circuits, changing the transparency or reflectance of an electrode passing through the transmissive area, or removing a polarizing plate of the transmissive area. Further, the transmissive area may be an area to which various methods are applied so that the transmittance of light is higher than that of other areas. For example, the transmissive area may replace the opening. The first camera device 205 may include, for example, under display camera (UDC). In another embodiment of the disclosure, some sensor modules 204 may be arranged to perform their functions without being visually exposed through the front plate 202 in the internal space of the electronic device. For example, in this case, an area of the display 201 facing the sensor module may not require a perforated opening.

According to various embodiments of the disclosure, the electronic device 200 may have a bar-type appearance or a plate-type appearance, but the disclosure is not limited thereto. For example, the illustrated electronic device 200 may be a part of a foldable electronic device, a slidable electronic device, a stretchable electronic device, and/or a rollable electronic device. A "foldable electronic device", a "slidable electronic device", a "stretchable electronic device", and/or a "rollable electronic device" may mean an electronic device in which a display may be bent and deformed so that at least a portion thereof is folded, or wound or rolled, or an area of a display is at least partially expanded and/or is accommodated inside a housing (e.g., the housing 210 in FIGS. 2A and 2B). A foldable electronic device, a slidable electronic device, a stretchable electronic device, and/or a rollable electronic device may be configured such that a display is unfolded or a larger area of a display is exposed to the outside so as to expand and use a screen display area thereof, according to user needs.

Figure 3:
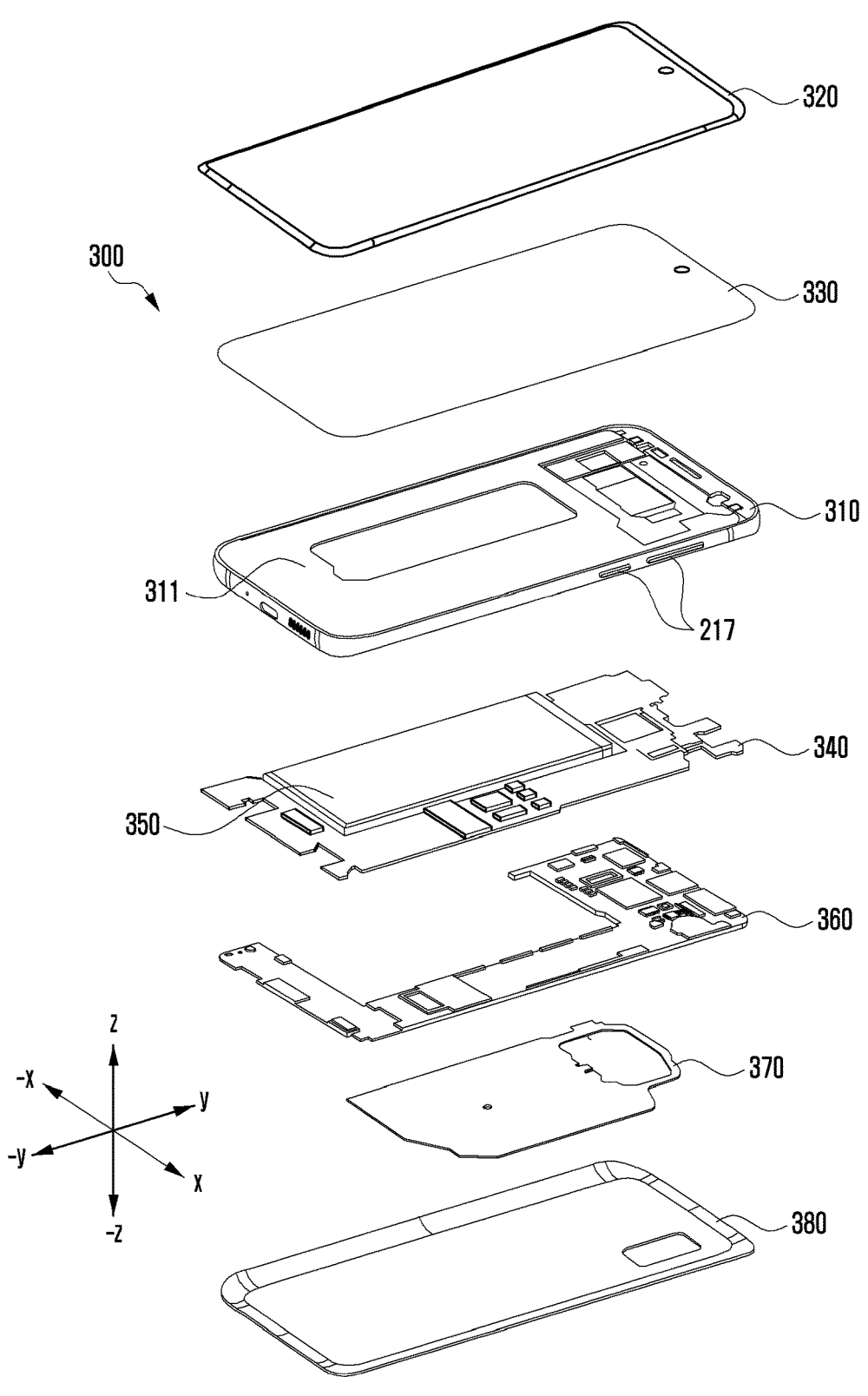
FIG. 3 is an exploded perspective view illustrating an electronic device of FIG. 2A according to an embodiment of the disclosure.

FIG. 3 is an exploded perspective view of an electronic device in FIGS. 2A and 2B according to an embodiment of the disclosure.

Referring to FIG. 3, an electronic device 300 may be at least partially similar to the electronic device 200 in FIGS. 2A and 2B, or may include another embodiment of the electronic device.

Referring to FIG. 3, the electronic device 300 (e.g., the electronic device 200 in FIG. 2A or 2B) may include a lateral member 310 (e.g., a lateral bezel structure), a first support member 311 (e.g., a bracket or a support structure), a front plate 320 (e.g., a front cover), a display 330 (e.g., the display 201 in FIG. 2A), a first substrate 340, a second substrate 360, a battery 350, an antenna 370, and a rear plate 380 (e.g., a rear cover). The first substrate 340 and the second substrate 360, for example, may be a printed circuit board (PCB), a flexible PCB (FPCB), or a rigid-flexible PCB (RFPCB). In some embodiments of the disclosure, at least one (e.g., the first support member 311 or the second substrate 360) of the elements may be omitted from the electronic device 300, or other elements may be additionally included therein. At least one of elements of the electronic device 300 may be the same as or similar to at least one of elements of the electronic device 200 in FIG. 2A or 2B, and overlapping descriptions thereof will be omitted hereinafter.

The first support member 311 may be disposed inside the electronic device 300, and may be connected to the lateral member 310 or integrally formed with the lateral member 310. For example, the first support member 311 may be formed of a metal material and/or a non-metal (e.g., polymer) material. The first support member 311 may have one surface to which the display 330 is coupled, and the other surface to which the first substrate 340 is coupled. A processor, a memory, and/or an interface may be mounted to the first substrate 340. For example, the processor may include one or more of a central processing device, an application processor, a graphic processing device, an image signal processor, a sensor hub processor, and a communication processor.

For example, the memory may include a volatile memory or a non-volatile memory.

For example, the interface may include a high definition multimedia interface (HDMI), a universal serial bus (USB) interface, an SD card interface, and/or an audio interface. For example, the interface may electrically or physically connect the electronic device 300 to an external electronic device, and may include a USB connector, an SD card/multimedia card (MMC) connector, or an audio connector.

The battery 350 may be a device for supplying power to at least one element of the electronic device 300, and for example, may include a non-rechargeable primary cell, a rechargeable secondary cell, or a fuel cell. For example, at least a part of the battery 350 may be disposed on substantially the same plane as the first substrate 340. The battery 350 may be integrally disposed inside the electronic device 300. As another embodiment of the disclosure, the battery 350 may also be disposed detachably from the electronic device 300.

The antenna 370 may be disposed between the rear plate 380 and the battery 350. For example, the antenna 370 may also include a near field communication (NFC) antenna, a wireless charging antenna, and/or a magnetic secure transmission (MST) antenna. For example, the antenna 370 may be configured to perform a short-range communication with an external device, or may wirelessly transmit/receive a power required for charging. In another embodiment of the disclosure, an antenna structure may be formed by a part of the lateral bezel structure 310 and/or the first support member 311, or a combination thereof.

Figure 4:
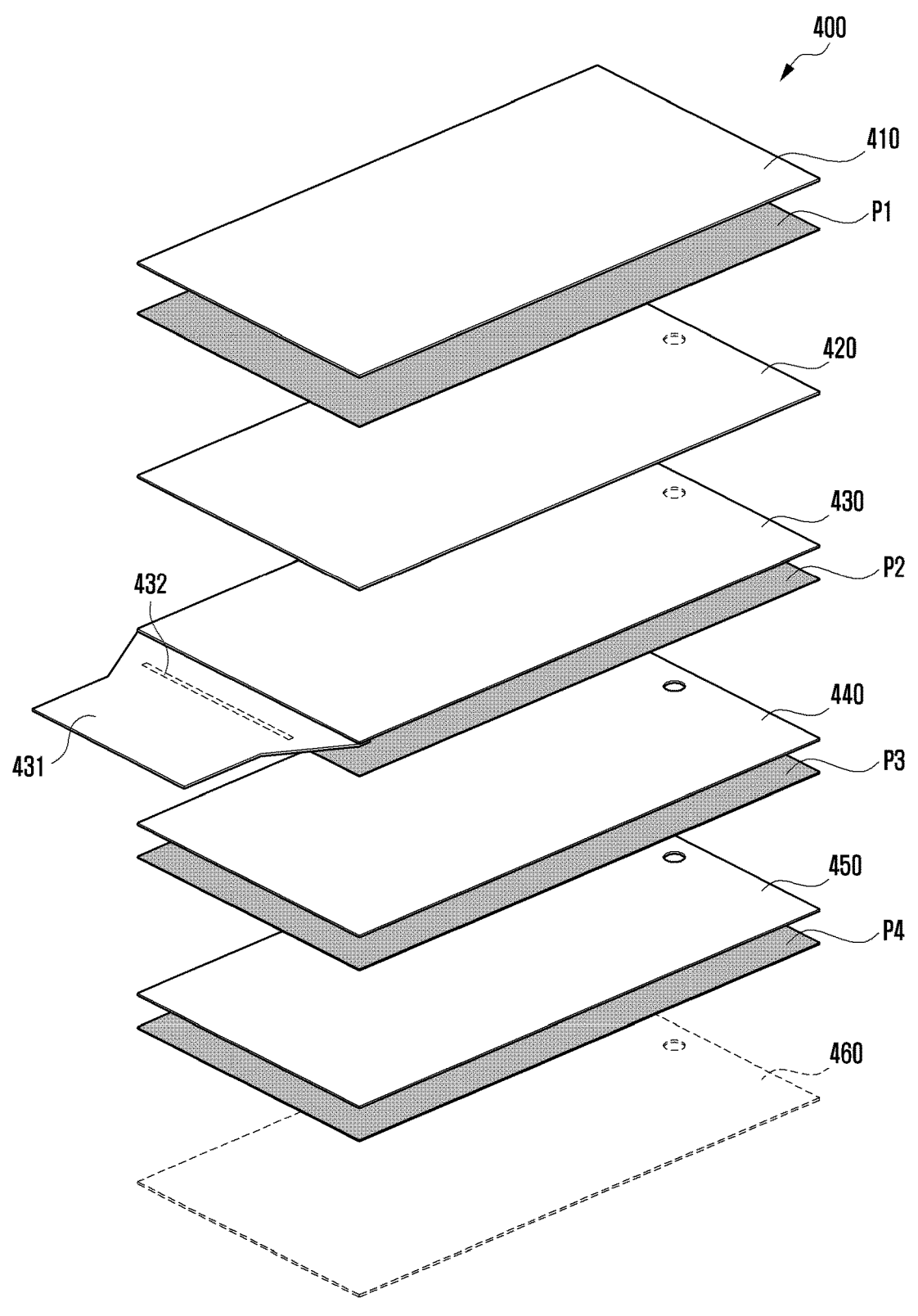
FIG. 4 is an exploded perspective view illustrating a display module according to an embodiment of the disclosure.

FIG. 4 is an exploded perspective view illustrating a display module according to an embodiment of the disclosure.

Referring to FIG. 4, a display module 400 according to various embodiments may include an unbreakable (UB) type OLED display (e.g., a curved display) panel 430. However, the disclosure is not limited thereto, and the display module 400 may include an on cell touch active matrix organic light-emitting diode (AMOLED) on-cell touch (OCTA) flat type display panel 430.

Referring to FIG. 4, the display module 400 may include a window layer 410 and a polarizer (POL) (e.g., a polarizing film) 420, a display panel 430, a polymer layer 440, and a metal sheet layer 450 sequentially disposed at the rear surface of the window layer 410. In some embodiments of the disclosure, the display panel 430 may include a digitizer 460 disposed between the polymer layer 440 and the metal sheet layer 450 or at the rear surface of the metal sheet layer 450.

According to various embodiments of the disclosure, the window layer 410 may include a glass layer. According to an embodiment of the disclosure, the window layer 410 may include ultra thin glass (UTG). In some embodiments of the disclosure, the window layer 410 may include a polymer. In this case, the window layer 410 may include polyethylene terephthalate (PET) or polyimide (PI). In some embodiments of the disclosure, window layer 410 may be disposed in a plurality of layers in order to include a glass layer and a polymer.

According to an embodiment of the disclosure, the window layer 410, the polarizer 420, the display panel 430, the polymer layer 440, and the metal sheet layer 450 may be attached to each other through adhesives (P1, P2, P3, and P4). For example, the adhesives P1, P2, P3, and P4 may include at least one of an optical clear adhesive (OCA), a pressure sensitive adhesive (PSA), a heat reactive adhesive, a general adhesive, or a double-sided tape.

According to various embodiments of the disclosure, the display panel 430 may include a plurality of pixels and a wiring structure (e.g., electrode pattern). According to an embodiment of the disclosure, the polarizer 420 may selectively pass light generated from a light source of the display panel 430 and vibrating in a predetermined direction. According to an embodiment of the disclosure, the display panel 430 and the polarizer 420 may be integrally formed. According to an embodiment of the disclosure, the display panel 430 may include a touch panel (not illustrated).

According to various embodiments of the disclosure, the polymer layer 440 may be disposed beneath the display panel 430 to provide a dark background for ensuring visibility of the display panel 430 and be made of a buffering material for a buffering action. In some embodiments of the disclosure, in order to waterproof the display module 400, the polymer layer 440 may be removed or disposed beneath the metal sheet layer 450.

According to an embodiment of the disclosure, the metal sheet layer 450 may include at least one of steel use stainless (SUS) (e.g., stainless steel (STS)), Cu, Al, or metal CLAD (e.g., a stacked member in which SUS and Al are alternately disposed). In some embodiments of the disclosure, the metal sheet layer 450 may include other alloy materials. In some embodiments of the disclosure, the metal sheet layer 450 may help reinforce the rigidity of the electronic device (e.g., the electronic device 200 of FIGS. 2A and 2B), shield ambient noise, and be used for dissipating a heat released from peripheral heat dissipation components.

According to various embodiments of the disclosure, the display module 400 may include a digitizer 460 disposed beneath the metal sheet layer 450 and as a detecting member that receives an input of an electronic pen (e.g., stylus). For example, the digitizer 460 may include a coil member disposed on a dielectric substrate in order to detect a resonant frequency of an electromagnetic induction method applied from the electronic pen.

According to various embodiments of the disclosure, the display module 400 may include at least one functional member (not illustrated) disposed between the polymer layer 440 and the metal sheet layer 450 or beneath the metal sheet layer 450. According to an embodiment of the disclosure, the functional member may include a graphite sheet for heat dissipation, a touch sensor for supporting a touch function of the display module 400, a force touch FPCB, a fingerprint sensor FPCB, an antenna radiator for communication, or a conductive/non-conductive tape.

According to various embodiments of the disclosure, the display module 400 may include a flexible printed circuit board 431 (e.g., a flexible printed circuit board 510 of FIG. 7B) disposed in a folding manner from the display panel 430 to at least a partial area of the rear surface of the display module 400. According to an embodiment of the disclosure, the flexible printed circuit board 431 may be electrically connected to the display panel 430. The flexible printed circuit board 431 may include a display driver integrated circuit (IC) (DDI) or a touch display driver IC (TDDI). The display module 400 may include a chip on film (COF) structure in which a DDI 432 is disposed at a flexible printed circuit board 431 electrically connected to the display panel 430. In another embodiment of the disclosure, the display module 400 may include a chip on panel or chip on plastic (COP) structure in which the DDI 432 is disposed at a portion of the display panel 430.

According to various embodiments of the disclosure, various elements related to driving of the display module 400 may be disposed at the flexible printed circuit board 431. For example, passive elements, such as a flash memory for a display, a diode for preventing ESD, a pressure sensor, and/or a decap may be disposed at the flexible printed circuit board 431.

Figure 5:
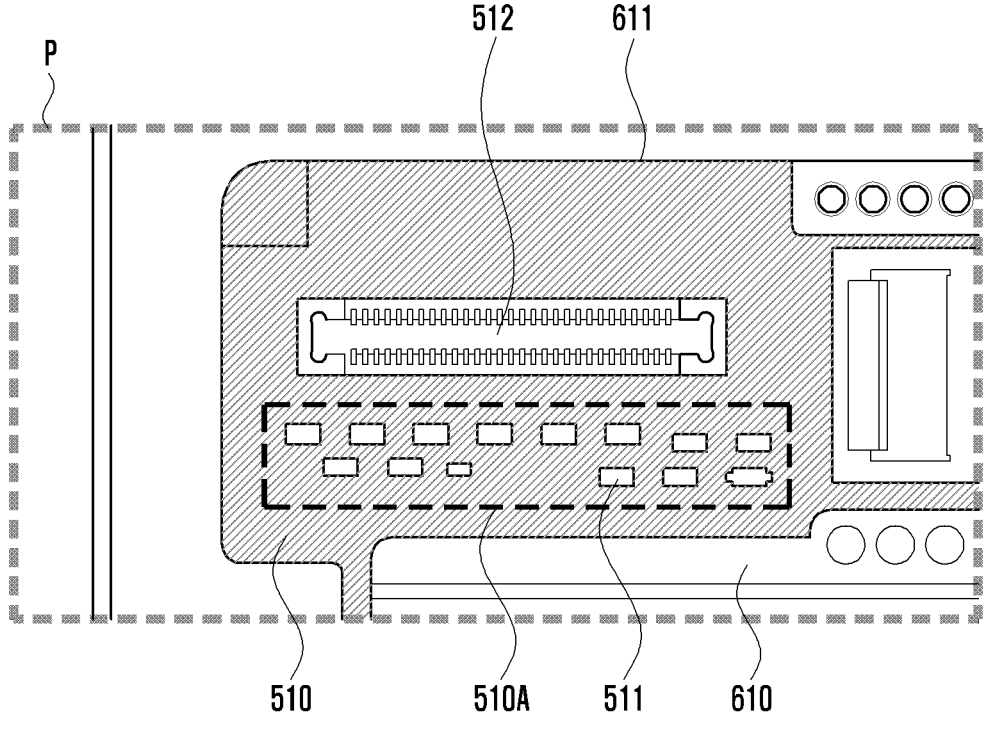
FIG. 5 is a diagram illustrating a portion of a display module according to an embodiment of the disclosure.

FIG. 5 is a diagram illustrating a portion of a display module according to an embodiment of the disclosure.

FIG. 5 illustrates a portion corresponding to an area P of FIG. 2B. FIG. 5 is an enlarged view of an area P in a state in which the rear plate 211 of FIG. 2B is removed.

According to various embodiments of the disclosure, the electronic device may include a flexible printed circuit board 510 of the display module (e.g., the display module 400 of FIG. 4 or the display module 160 of FIG. 1). The flexible printed circuit board 510 may transmit various signals related to an operation of the display module. Further, various electronic components 511 related to the operation of the display module may be disposed at the flexible printed circuit board 510.

According to various embodiments of the disclosure, a first connection part 512 and the electronic component 511 may be disposed at the flexible printed circuit board 510.

The first connection part 512 may be connected to a second connection part (e.g., a second connection part 522 of FIG. 6) of a connecting member (e.g., a connecting member 520 of FIG. 6) to be described later. As the first connection part 512 and the second connection part 522 are connected, the flexible printed circuit board 510 and the connecting member 520 may be electrically connected. For example, the connecting member 520 connected to the flexible printed circuit board 510 may be electrically connected to the printed circuit board of the electronic device (e.g., the electronic device 101 of FIG. 1 or the electronic device 300 of FIG. 3). The flexible printed circuit board 510 may be electrically connected to the printed circuit board of the electronic device by the connecting member 520. The first connection part 512 may be understood as a component capable of transferring electrical signals by being coupled to other components (e.g., the second connection part 522 of FIG. 6). For example, the first connection part 512 may include a coupling structure, such as a socket, a solder pad, or a clip. The second connection part may include a structure corresponding to the coupling structure of the first connection part 512. For example, the first connection part 512 may have a female structure, and the second connection part may have a male structure so that the first connection part 512 and the second connection part may be coupled.

In an embodiment of the disclosure, at least one electronic component 511 may be disposed at the flexible printed circuit board 510. For example, as illustrated in FIG. 5, a certain electronic component 511 may be disposed in an area adjacent to the first connection part 512 (hereinafter, referred to as a "component mounting area 510A"). The electronic component 511 disposed in a component mounting area 510A may be an electronic component 511 related to an operation of the display module. For example, an electronic component 511 including a passive element, such as a flash memory for a display, a diode for preventing ESD, a pressure sensor, or a decap or a passive element and an active element may be disposed in the component mounting area 510A. The type of electronic component 511 disposed in the component mounting area 510A is not limited thereto, and various electronic components 511 obvious to those skilled in the art may be disposed in the component mounting area 510A.

In an embodiment of the disclosure, a front housing 610 may be a housing of an electronic device disposed to cover a portion of the display module. The front housing 610 may partition a portion in which the display module is disposed and a portion in which other electronic components or instruments are disposed, and support the display module or protect the display module from an external impact. As illustrated in FIG. 5, the front housing 610 may include a recess 611. The recess 611 may be an opening formed in a portion of the front housing 610.

Referring to FIG. 5, the first connection part 512 of the flexible printed circuit board 510 and the component mounting area 510A may be exposed through the recess 611 formed in the front housing 610. The first connection part 512 of the flexible printed circuit board 510 and the component mounting area 510A may be positioned at a portion in which the recess 611 of the front housing 610 is formed. The reason why the first connection part 512 and the component mounting area 510A are exposed through the recess 611 of the front housing 610 may be as follows. Because the first connection part 512 is a part connected to the second connection part 522 of the connecting member 520, it may be necessary that the first connection part 512 is not covered by the front housing 610. The front housing 610 may not be extended to a portion covering the electronic component 511 because of, for example, a height of the electronic component 511 disposed in the component mounting area 510A (a length protruded from the surface of the flexible printed circuit board 510).

Figure 6:
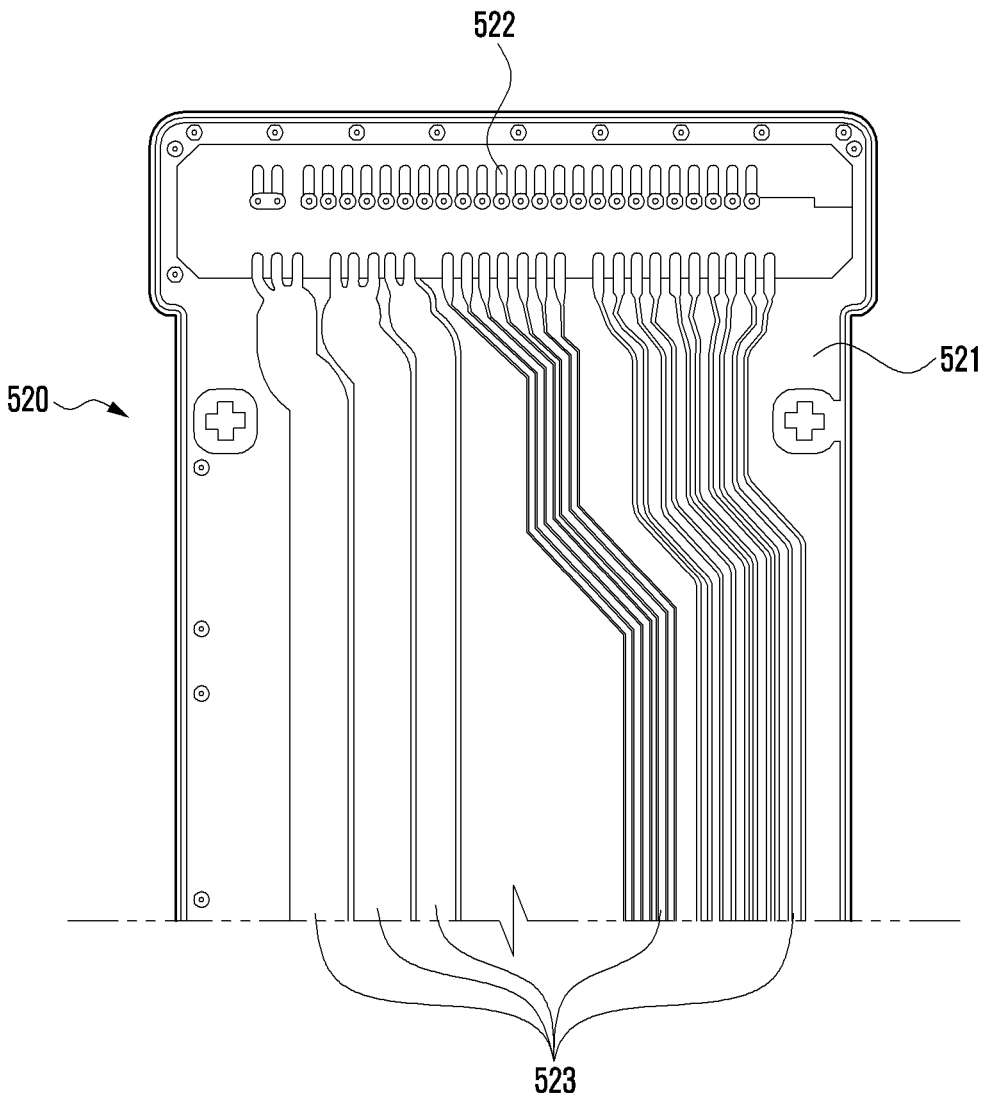
FIG. 6 is a schematic diagram illustrating a connecting member according to an embodiment of the disclosure.

FIG. 6 is a schematic diagram illustrating a connecting member according to an embodiment of the disclosure.

Referring to FIG. 6, according to various embodiments of the disclosure, the connecting member 520 may be made of a flexible material. For example, a partial section of the connecting member 520 may be bent. A plurality of wirings 523 may be disposed at the connecting member 520 so that the connecting member 520 may transfer electrical signals. The plurality of wirings 523 may be disposed to be segmented (insulated) from each other on substantially the same plane or may be disposed to be segmented from each other on different planes. For example, the connecting member 520 may include a plurality of conductive layers (e.g., the conductive layers L1 to L4 of part (b) of FIG. 10A). In the case that the connecting member 520 includes a plurality of conductive layers, the plurality of wiring 523 may be segmented and disposed on different planes.

According to various embodiments of the disclosure, at least one of the plurality of wirings 523 disposed at the connecting member 520 may be a ground 521. According to various embodiments of the disclosure, at least one of the plurality of conductive layers included in the connecting member 520 may be electrically connected to the ground part formed in the printed circuit board of the electronic device (e.g., the electronic device 300 of FIG. 3) to be the ground 521.

According to various embodiments of the disclosure, the second connection part 522 may be electrically connected to the plurality of wirings 523 disposed at the connecting member 520. The second connection part 522 may be, for example, a component detachably coupled to a component electrically connected to the connecting member 520. In an embodiment of the disclosure, the second connection part 522 may be detachably coupled to the first connection part (e.g., the first connection part 512 of FIG. 5) of the flexible printed circuit board (e.g., the flexible printed circuit board 510 of FIG. 5). The second connection part 522 may be various components that are coupled to the first connection part and that transfer electrical signals. For example, in the case that the first connection part has a socket shape, the second connection part 522 may have a connector shape inserted into the socket. In the case that the first connection part is a solder pad, the second connection part 522 may be a conductive pad that may be soldered to the solder pad. In the case that the first connection part is a clip, the second connection part 522 may be inserted into the clip. In some cases, the first connection part and the second connection part 522 may be bonded using a conductive adhesive.

According to various embodiments of the disclosure, the flexible printed circuit board of the display module may be electrically connected to the printed circuit board of the electronic device by the connecting member 520.

Figure 7A:
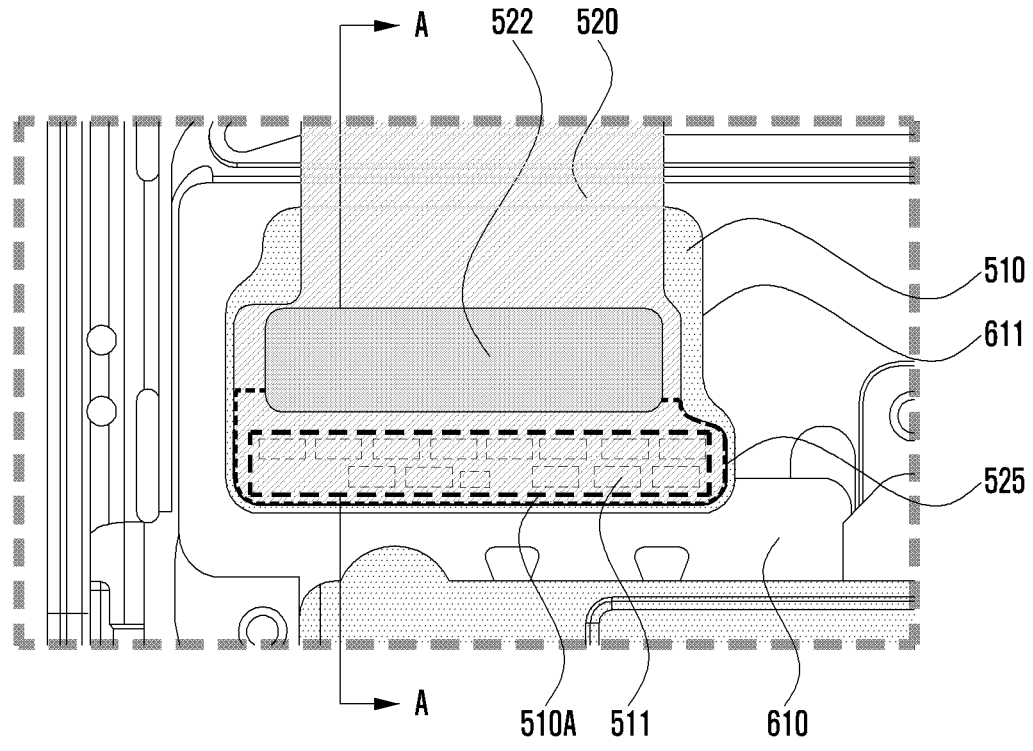
FIG. 7A is a diagram illustrating a state in which a flexible printed circuit board and a connecting member are connected according to an embodiment of the disclosure.

FIG. 7A is a diagram illustrating a state in which a flexible printed circuit board and a connecting member are connected according to an embodiment of the disclosure.

Figure 7B:
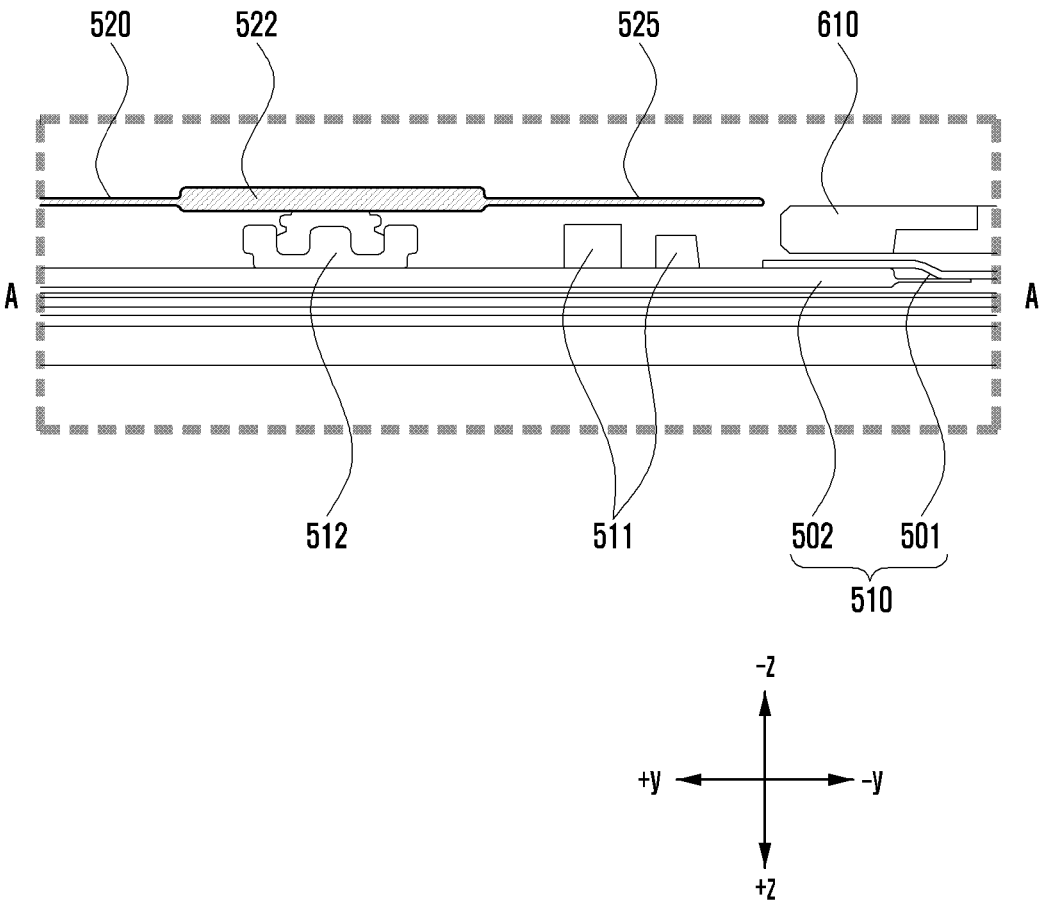
FIG. 7B is a cross-sectional view taken along line A-A illustrated in FIG. 7A according to an embodiment of the disclosure.

FIG. 7B is a cross-sectional view taken along line A-A illustrated in FIG. 7A according to an embodiment of the disclosure.

In the following description, the same reference numerals are used for elements identical or similar to those described in FIGS. 5 and 6, and a detailed description thereof will be omitted.

Referring to FIGS. 7A and 7B, the flexible printed circuit board 510 and the connecting member 520 may be electrically connected. In an embodiment of the disclosure, as the first connection part 512 of the flexible printed circuit board 510 and the second connection part 522 of the connecting member 520 are connected, the flexible printed circuit board 510 and the connecting member 520 may be electrically connected.

Referring to FIG. 7B, the flexible printed circuit board 510 may include a first substrate member 501 and a second substrate member 502. In an embodiment of the disclosure, the first substrate member 501 may be connected to a display panel (e.g., the display panel 430 of FIG. 4). The first substrate member 501 may be made of a film material. According to various embodiments of the disclosure, a display driver integrated circuit (IC) (DDI) (e.g., the DDI 432 of FIG. 4), which is a circuit related to driving of a display panel may be disposed at the first substrate member 501 or the second substrate member 502. The second substrate member 502 may be electrically connected to the first substrate member 501. The first connection part 512 of the flexible printed circuit board 510 may be disposed at the second substrate member 502, and a partial area of the second substrate member 502 may be a component mounting area 510A in which the electronic component 511 of the flexible printed circuit board 510 is disposed.

In another embodiment of the disclosure, the first substrate member 501 may be a portion in which a substrate of the display panel is extended. The substrate of the display panel may include a substrate extension part 501 in which a portion of the substrate is extended. The substrate of the display panel may be a substrate in which various elements (e.g., light emitting elements, TFTs) included in the display panel are disposed. The substrate of the display panel may be made of a flexible material (e.g., polyethylene terephthalate (PET) or polyimide (PI)). A portion of the first substrate member 501, which is an extension part of the display panel, may be bent. The DDI may be disposed at the first substrate member 501. The first substrate member 501, which is an extension part of the display panel in which the DDI is disposed, may be electrically connected to the second substrate member 502.

In an embodiment of the disclosure, the component mounting area 510A of the flexible printed circuit board 510 may be exposed through the recess 611 of the front housing 610. Electronic components 511 disposed in the component mounting area 510A may be exposed through the recess 611 of the front housing 610. In this way, the exposed electronic components 511 may be vulnerable to electro static discharge (ESD). Electric charges may flow to various electronic components 511 included in the electronic device or parts of various electrical objects including conductive materials according to the operation of the electronic device. In some cases, some of the electric charges may not flow but may be accumulated. An ESD phenomenon may occur as the accumulated electric charge momentarily moves to another part. The electronic component 511 may be damaged due to a voltage difference generated at the moment the electric charges move. For example, when an ESD phenomenon occurs in the electronic component 511 disposed at the flexible printed circuit board 510, the electronic component 511 may be damaged.

Referring to FIGS. 7A and 7B, the connecting member 520 connected to the flexible printed circuit board 510 may include an extension part 525. The extension part 525 may be a part of the connecting member 520. In another embodiment of the disclosure, the extension part 525 may be formed separately from the connecting member 520 to be connected to the connecting member 520. The extension part 525 may be a part extended to cover the component mounting area 510A of the flexible printed circuit board 510. In various embodiments disclosed in this document, the component mounting area 510A exposed through the recess 611 of the front housing 610 may be at least partially covered by the extension part 525 of the connecting member 520. In this way, because the extension part 525 covers the component mounting area 510A, the possibility of an ESD phenomenon occurring in the electronic component 511 disposed in the component mounting area 510A may be reduced. Accordingly, the problem caused by the ESD phenomenon described above may be alleviated or eliminated.

Figure 8A:
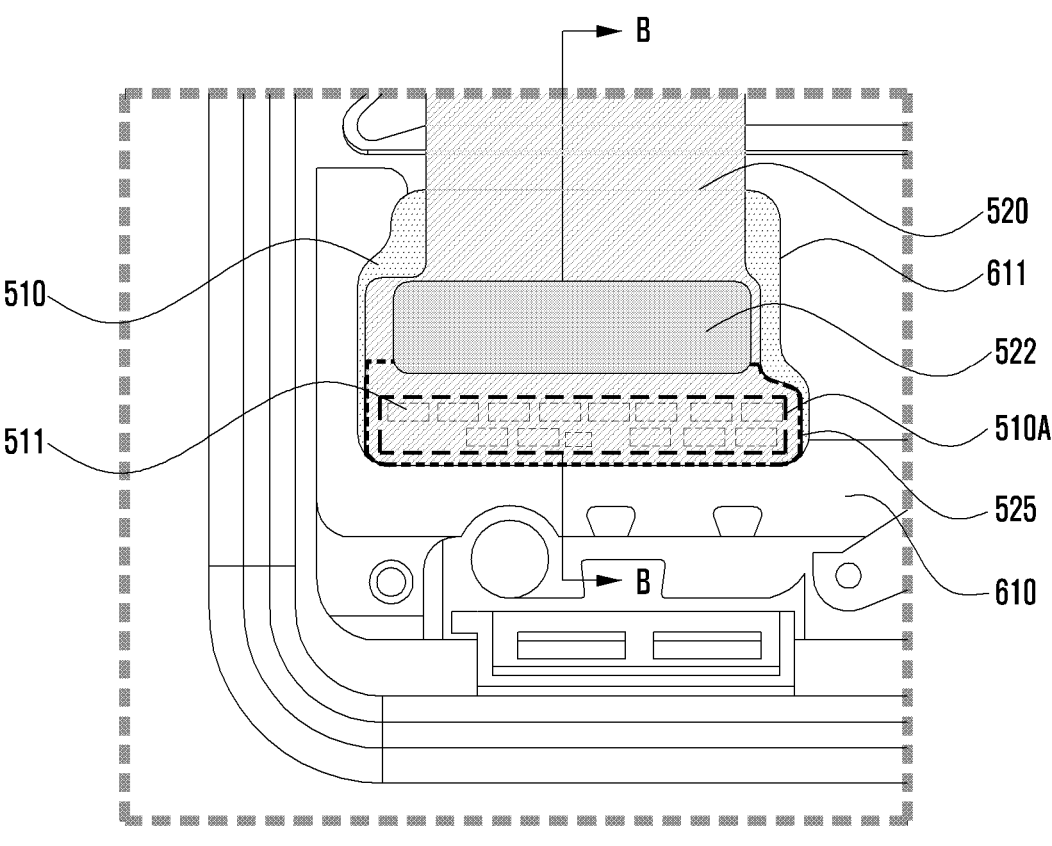
FIG. 8A is a diagram illustrating a state in which a flexible printed circuit board and a connecting member are connected according to an embodiment of the disclosure.

FIG. 8A is a diagram illustrating a state in which a flexible printed circuit board and a connecting member are connected according to an embodiment of the disclosure.

Figure 8B:
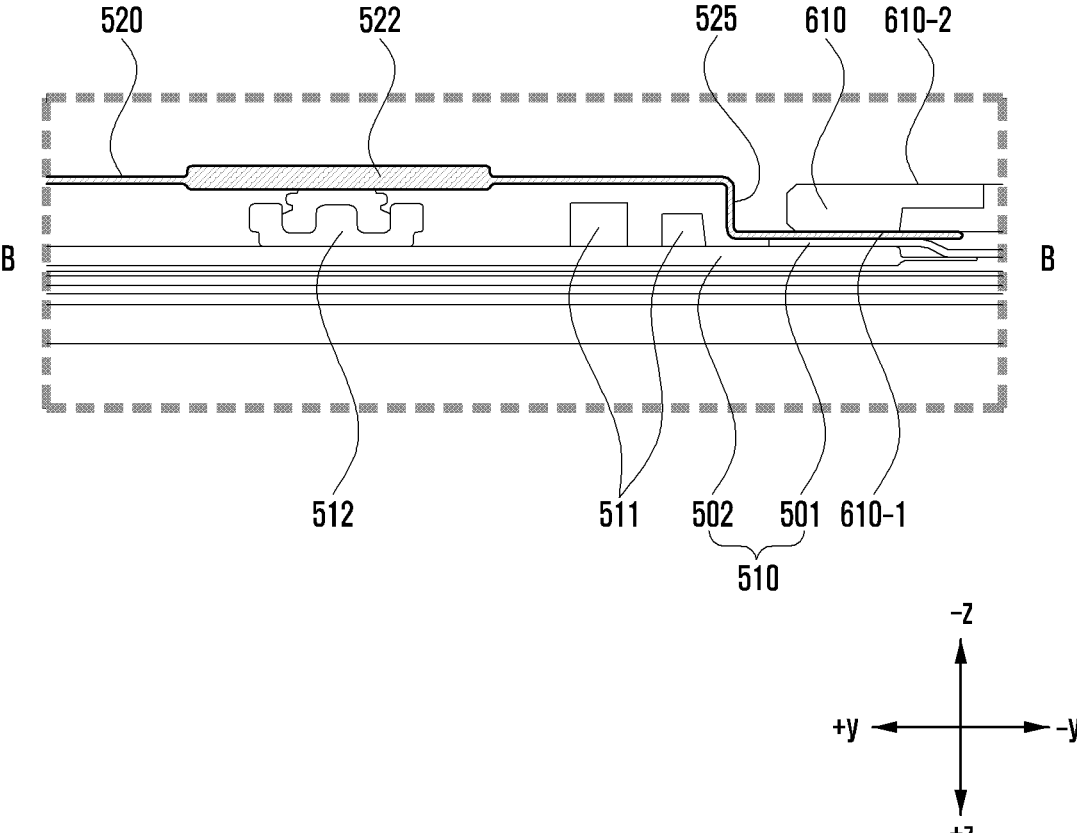
FIG. 8B is a cross-sectional view taken along line B-B illustrated in FIG. 8A according to an embodiment of the disclosure.

FIG. 8B is a cross-sectional view taken along line B-B illustrated in FIG. 8A according to an embodiment of the disclosure.

In the following description, the same reference numerals are used for elements identical or similar to those illustrated in FIGS. 7A and 7B, and a detailed description thereof will be omitted.

In the embodiment illustrated in FIGS. 8A and 8B, the extension part 525 of the connecting member 520 may be extended to cover the electronic component 511 disposed in the component mounting area 510A of the flexible printed circuit board 510. In this embodiment of the disclosure, the extension part 525 may be extended so that at least a portion thereof may be disposed between the flexible printed circuit board 510 and the front housing 610.

Referring to FIG. 8B, a portion of the extension part 525 may be disposed between the front housing 610 and the flexible printed circuit board 510. When a surface of the front housing 610 facing the flexible printed circuit board 510 is referred to as a first surface 610-1 (e.g., a surface facing in the +Z direction of FIG. 8B), and the opposite surface is referred to as a second surface 610-2 (e.g., a surface facing in the −Z direction of FIG. 8B), a portion of the extension part 525 may be disposed to contact the first surface 610-1 of the front housing 610. In an embodiment of the disclosure, an adhesive member (not illustrated) may be disposed between the front housing 610 and the extension part 525. The adhesive member may fix the extension part 525 to the front housing 610. Because the extension part 525 may be stably fixed between the front housing 610 and the flexible printed circuit board 510 even if an impact is applied to the electronic device, the extension part 525 may maintain a state that covers the electronic component 511 disposed in the flexible printed circuit board 510.

Figure 9A:
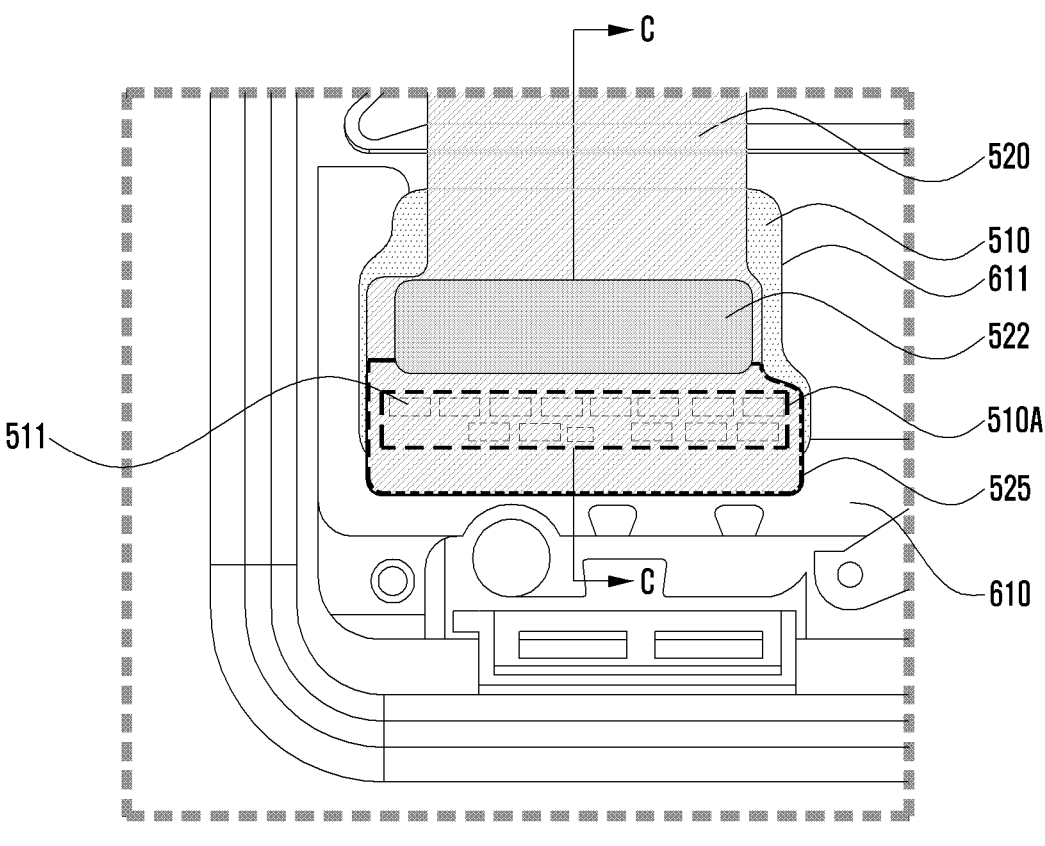
FIG. 9A is a diagram illustrating a state in which a flexible printed circuit board and a connecting member are connected according to an embodiment of the disclosure.

FIG. 9A is a diagram illustrating a state in which a flexible printed circuit board and a connecting member are connected according to an embodiment of the disclosure.

Figure 9B:
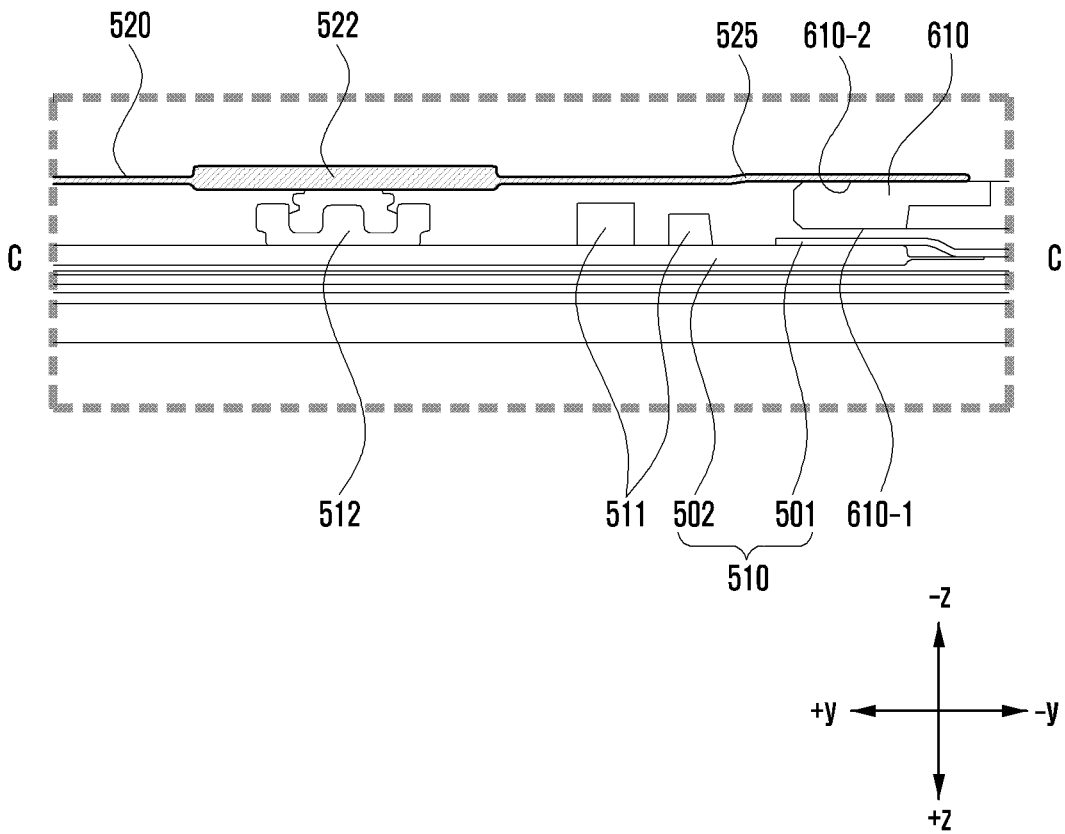
FIG. 9B is a cross-sectional view taken along line C-C illustrated in FIG. 9A according to an embodiment of the disclosure.

FIG. 9B is a cross-sectional view taken along line C-C illustrated in FIG. 9A according to an embodiment of the disclosure.

In the following description, the same reference numerals are used for elements identical or similar to those illustrated in FIGS. 7A, 7B, 8A, and 8B, and a detailed description thereof will be omitted.

In the embodiment of the disclosure illustrated in FIGS. 9A and 9B, the extension part 525 of the connecting member 520 may be extended to cover the electronic component 511 disposed in the component mounting area 510A of the flexible printed circuit board 510. In this embodiment of the disclosure, a portion of the extension part 525 may be formed to be extended so that it may be attached to the front housing 610.

Referring to FIG. 9B, a portion of the extension part 525 may be extended to one surface 610-2 of the front housing 610. When a surface of the front housing 610 facing the flexible printed circuit board 510 is referred to as a first surface 610-1 and the opposite surface is referred to as a second surface 610-2, a portion of the extension part 525 may be disposed to contact the second surface 610-2 of the front housing 610. In an embodiment of the disclosure, an adhesive member (not illustrated) may be disposed between the second surface 610-2 of the front housing 610 and the extension part 525. The adhesive member may fix the extension part 525 to the front housing 610. Because the extension part 525 may be stably fixed to the front housing 610 even if an impact is applied to the electronic device, the extension part 525 may maintain a state that covers the electronic component 511 disposed at the flexible printed circuit board 510.

Figure 10A:
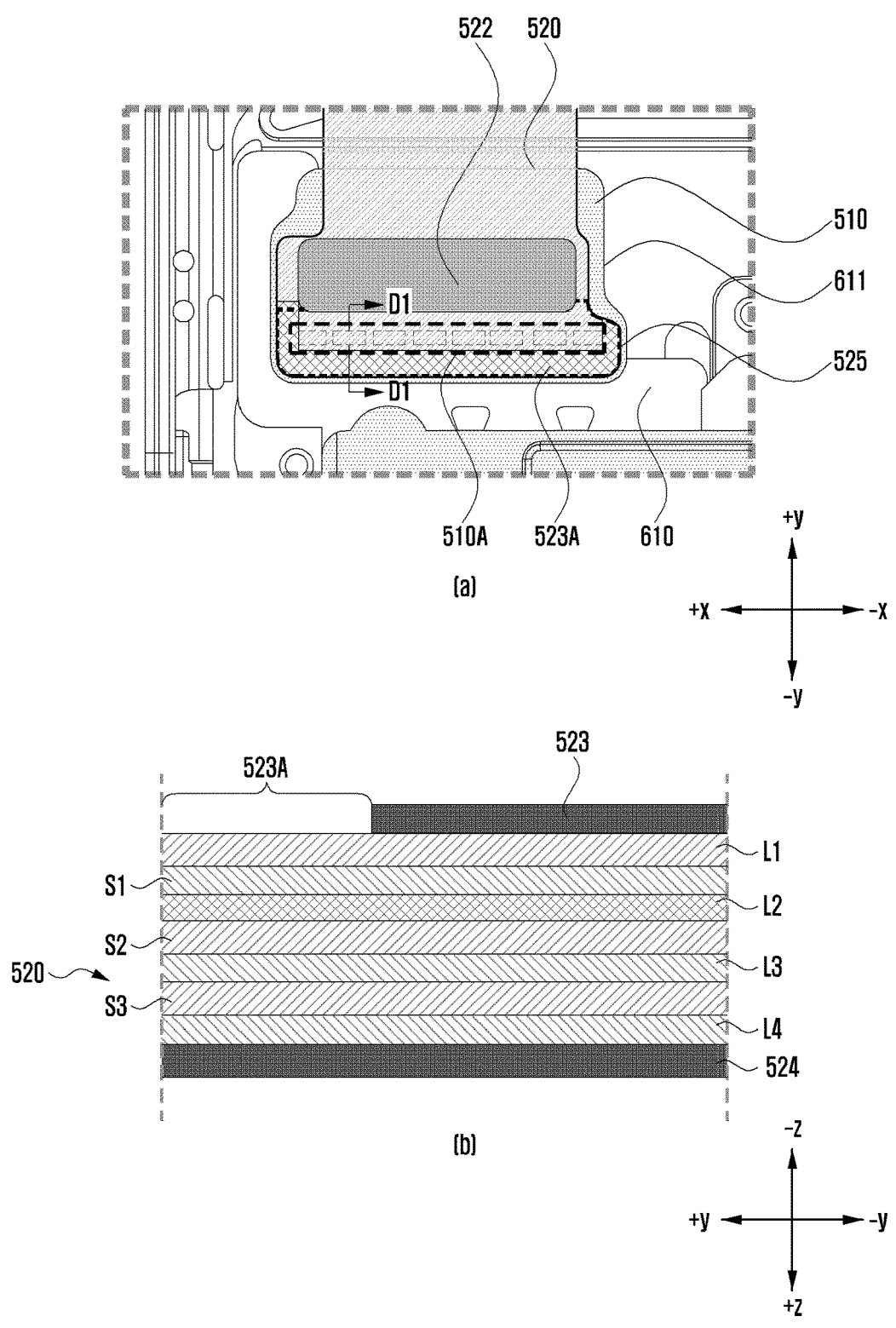
FIGS. 10A, 10B, and 10C are diagrams illustrating a portion in which a flexible printed circuit board and a connecting member are connected and cross-sectional views illustrating the connecting member according to various embodiments of the disclosure.
Figure 10B:
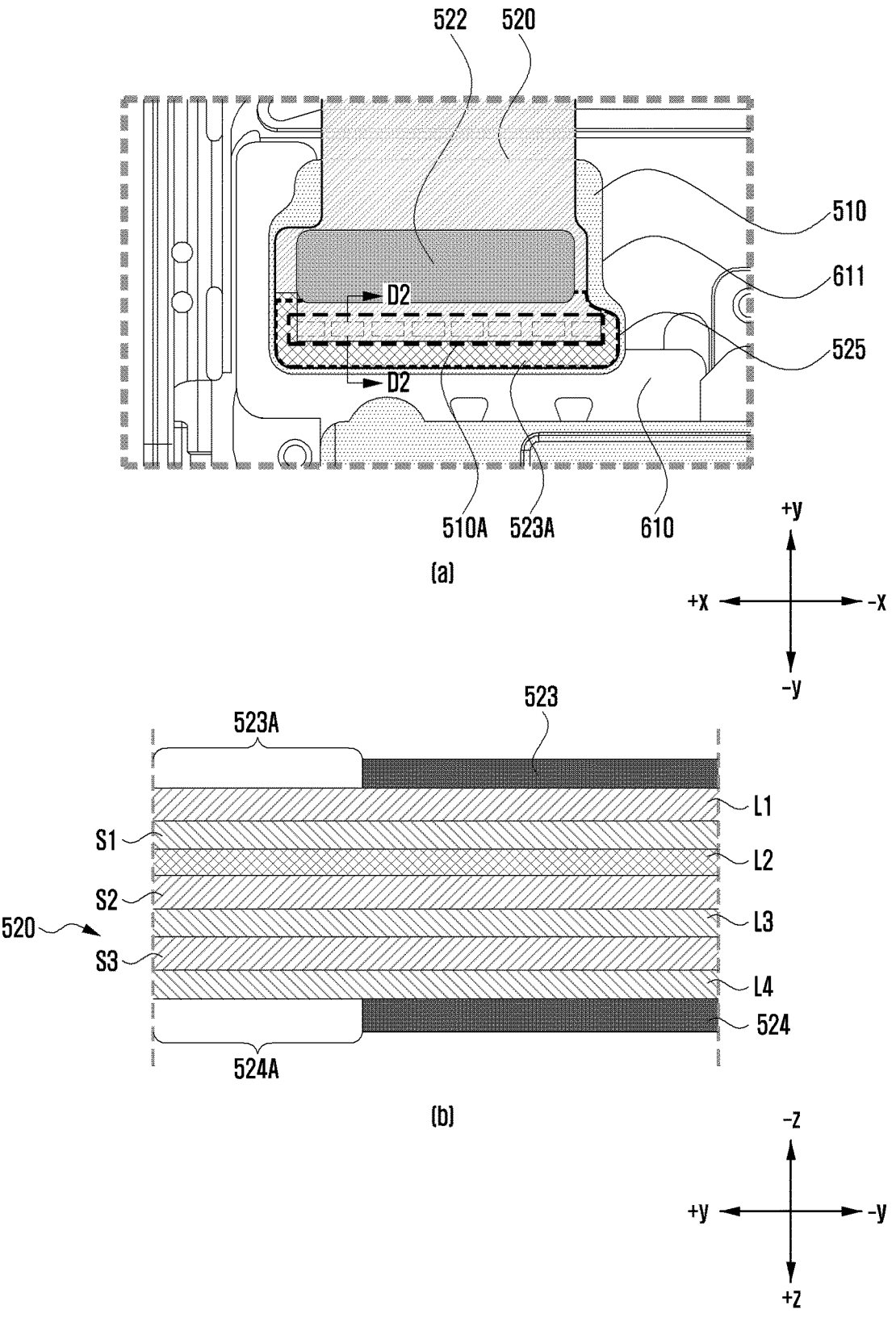
Figure 10C:
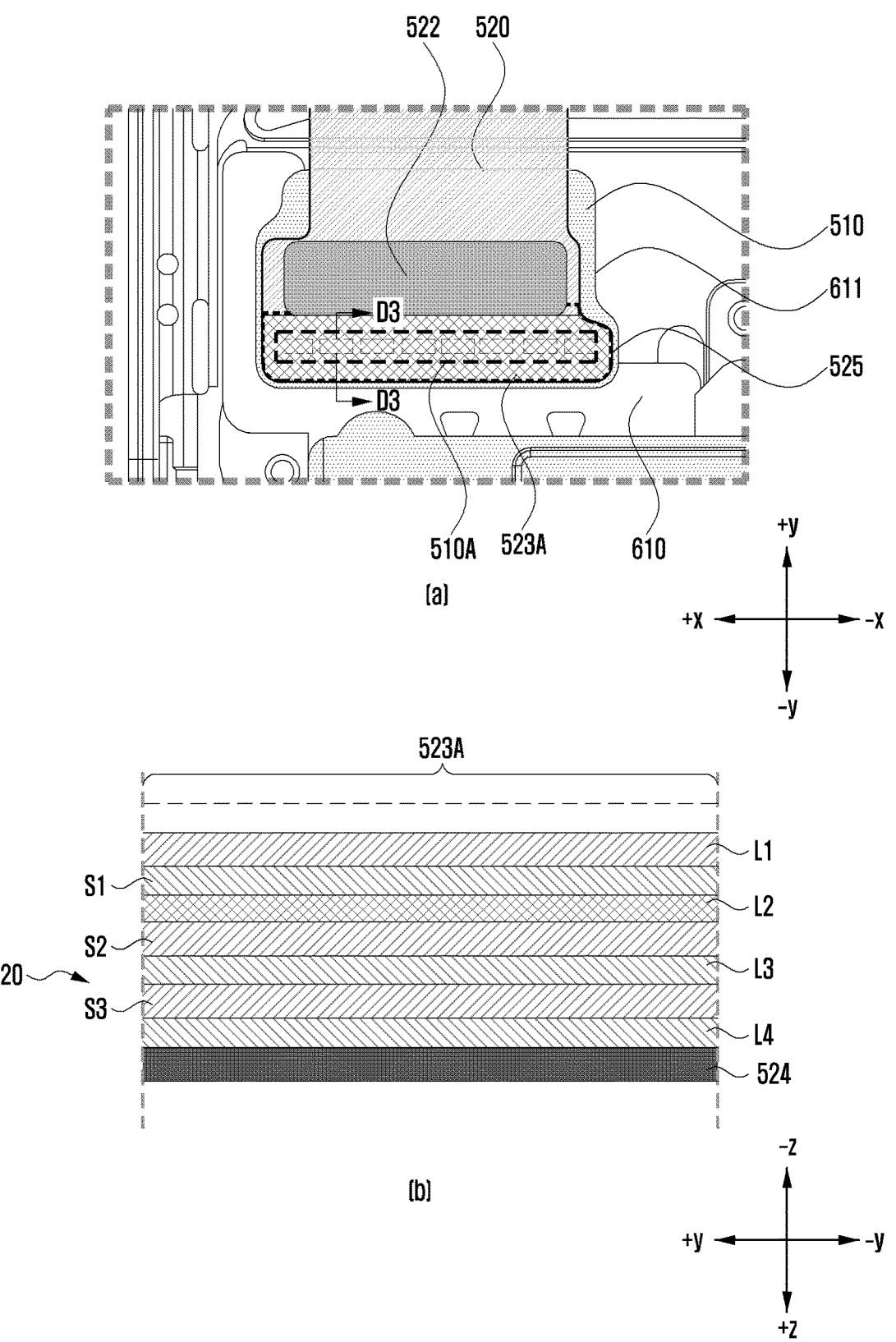

FIGS. 10A, 10B, and 10C are diagrams illustrating various embodiments of the disclosure.

In the following description, the same reference numerals are used for elements identical or similar to those illustrated in FIGS. 7A, 7B, 8A, 8B, 9A, and 9B, and a detailed description thereof will be omitted.

Part (b) of FIG. 10A is a cross-sectional view taken along D1-D1 illustrated in part (a) of FIG. 10A. Referring to part (b) of FIG. 10A, the connecting member 520 may include a structure in which a plurality of conductive layers are stacked. For example, the connecting member 520 may include a plurality of conductive layers L1, L2, L3, and L4, and adhesive layers S1, S2, and S3 disposed between the plurality of conductive layers L1, L2, L3, and L4. The plurality of conductive layers L1, L2, L3, and L4 may be components that transfer electrical signals. The adhesive layers S1, S2, and S3 may be made of an insulating material or a material having a high permittivity in order to electrically separate the plurality of conductive layers L1, L2, L3, and L4, and may be a component for adhering the plurality of conductive layers L1, L2, L3, and L4 to each other. The adhesive layers S1, S2, and S3 may include, for example, at least one of an optical clear adhesive (OCA), pressure sensitive adhesive (PSA), heat reactive adhesive, general adhesive, or double-sided tape.

According to various embodiments of the disclosure, the connecting member 520 may include coating layers 523 and 524. The coating layers 523 and 524 may form an outer surface of the connecting member 520. The coating layers 523 and 524 may be stacked to at least one (e.g., L1 and L4 based on part (b) of FIG. 10A) of the plurality of conductive layers L1, L2, L3, and L4 included in the connecting member 520. The coating layers 523 and 524 may protect the plurality of conductive layers L1, L2, L3, and L4. Further, the coating layers 523 and 524 may be made of an insulating material. The coating layer may be, for example, photo solder resist (PSR) and a photocurable material.

According to various embodiments of the disclosure, referring to part (b) of FIG. 10A, the coating layers 523 and 524 may include a first coating layer 523 and a second coating layer 524. The first coating layer 523 may be a coating layer disposed in at least a portion of one surface of the connecting member 520 (e.g., a surface facing in the +Z direction of part (b) of FIG. 10A). The second coating layer 524 may be a coating layer disposed in at least a portion of the other surface of the connecting member 520 (e.g., a surface facing in the –Z direction in part (b) of FIG. 10A).

For example, in the connecting member 520, the second coating layer 524 may be a coating layer disposed in at least a portion of a surface (other surface) facing the flexible printed circuit board 510.

In an embodiment of the disclosure, as illustrated in part (b) of FIG. 10A, the first coating layer 523 may be disposed in only a portion of one surface of the connecting member 520. The conductive layer may be exposed by a first ground area 523A, which is a portion in which the first coating layer 523 is not disposed. For example, the first coating layer 523 may not be disposed in a partial area of the extension part 525. The conductive layer L1 exposed by the first ground area 523A may be a ground (e.g., the ground 521 of FIG. 6) electrically connected to a ground part (not illustrated) of the printed circuit board of the electronic device (e.g., the electronic device 300 of FIG. 3). The conductive layer connected to the ground part may have a relatively low potential. Electric charges accumulated around the connecting member 520 may be induced to the conductive layer L1 exposed by the first ground area 523A having a relatively low potential. The conductive member L1 exposed by the first ground area 523A of the connecting member 520 may absorb ambient electric charges to prevent electric charge accumulation. Therefore, an ESD phenomenon around the connecting member 520 may be alleviated or eliminated.

In another embodiment of the disclosure, as illustrated in part (b) of FIG. the first coating layer 523 may be disposed in only a portion of one surface of the connecting member 520. Further, the second coating layer 524 may be disposed in only a portion of the other surface of the connecting member 520. For example, the first coating layer 523 and the second coating layer 524 may not be disposed in some areas of the extension part 525. The conductive layer L1 may be exposed by the first ground area 523A, which is a portion in which the first coating layer 523 is not disposed, and a conductive layer L4 may be exposed by the second ground area 524A, which is a portion in which the second coating layer 524 is not disposed. The conductive layer L1 exposed by the first ground area 523A and the conductive layer L4 exposed by the second ground area 524A may be a ground electrically connected to a ground part of the printed circuit board of the electronic device. The conductive members L1 and L4 exposed by the first ground area 523A and/or the second ground area 524A of the connecting member 520 may absorb ambient electric charges to prevent electric charge accumulation. Therefore, an ESD phenomenon around the connecting member 520 may be alleviated or eliminated.

In another embodiment of the disclosure, as illustrated in part (b) of FIG. a first coating layer 523 may not be disposed in a portion corresponding to the component mounting area 510A of the flexible printed circuit board 510 of one surface of the connecting member 520. For example, the first coating layer 523 may not be disposed in an area corresponding to the extension part 525. The conductive layer L1 may be exposed by the first ground area 523A, which is a portion in which the first coating layer 523 is not disposed. The conductive layer L1 exposed by the first ground area 523A may be a ground electrically connected to a ground part of the printed circuit board of the electronic device. The conductive member exposed by the first ground area 523A of the connecting member 520 may absorb ambient electric charges to prevent electric charge accumulation. Therefore, an ESD phenomenon around the connecting member 520 may be alleviated or eliminated.

As described above, the ground areas 523A and 524A in which the coating layers 523 and 524 are not disposed may be areas in which portions of the coating layers 523 and 524 are removed. In some embodiments of the disclosure, in order to prepare the ground areas 523A and 524A, the connecting member 520 may be formed by stacking the coating layers 523 and 524 on only portions of the conductive layers L1 and L4.

FIGS. 11A, 11B, 11C, and 11D are cross-sectional views illustrating an extension part of a connecting member according to various embodiments of the disclosure.

Referring to FIGS. 11A, 11B, 11C, and 11D, components identical or similar to those of FIG. 7B will be described using the same member numbers, and a detailed description thereof will be omitted and the description will focus on differences.

The extension part 525 of the connecting member 520 may be a part extended to cover at least some of various electronic components 511 disposed at the second substrate member 502. The extension part 525 may be variously changed.

Figure 11A:
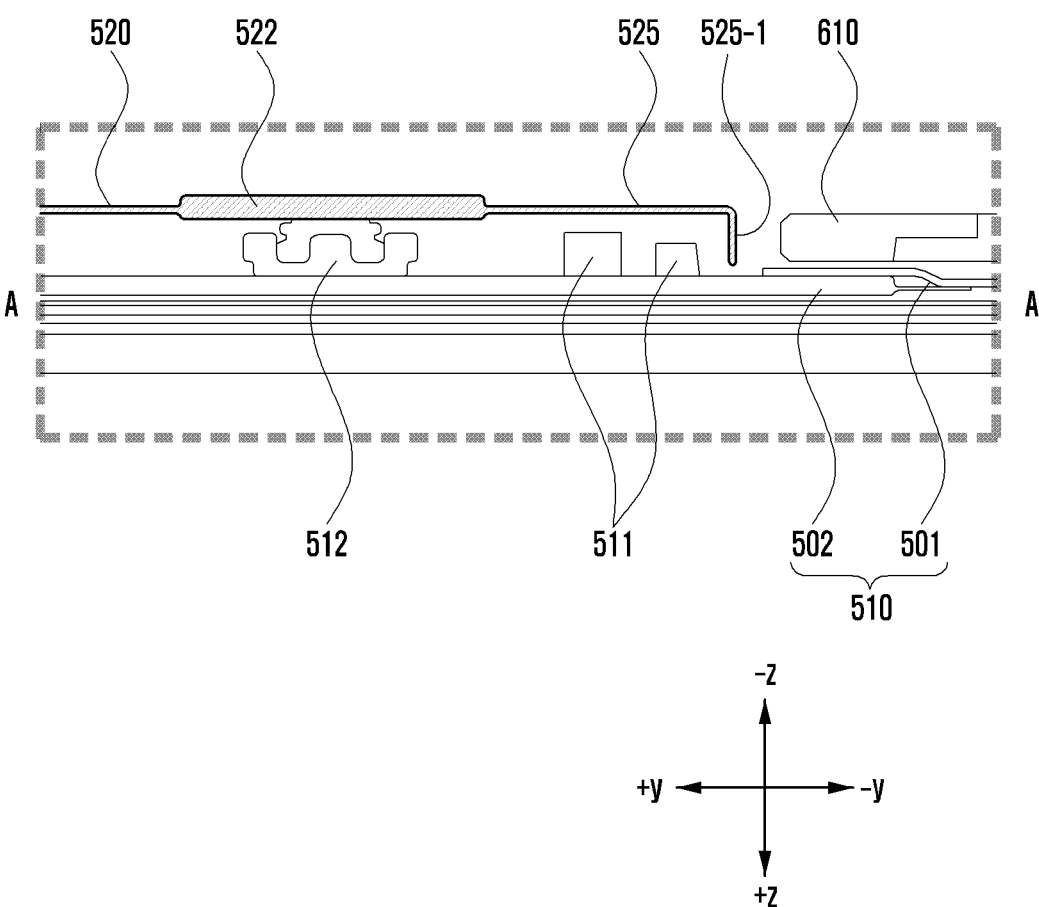
FIGS. 11A, 11B, 11C, and 11D are cross-sectional views illustrating an extension part of a connecting member according to various embodiments of the disclosure.

Referring to FIG. 11A, at least a portion 525-1 of the extension part 525 may be bent toward the second substrate member 502 at which the electronic component 511 is disposed.

Figure 11B:
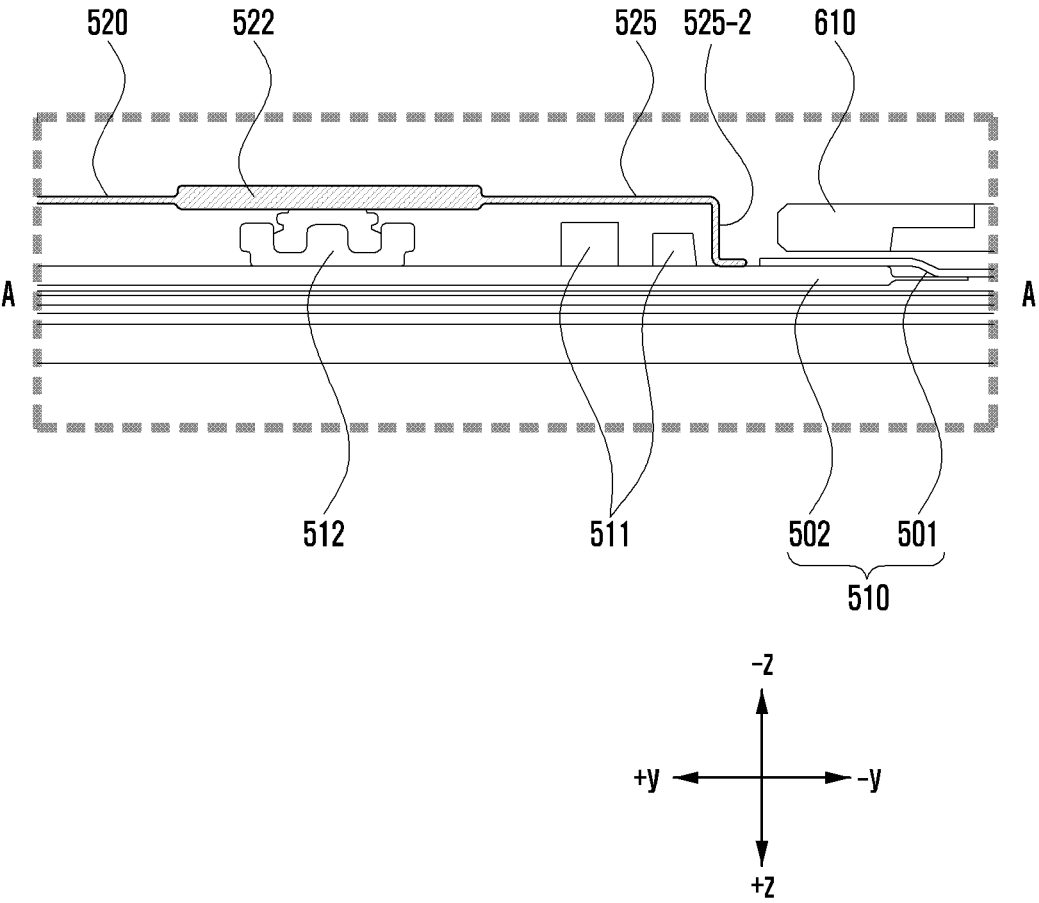

Referring to FIG. 11B, at least a portion 525-2 of the extension part 525 may be bent toward the second substrate member 502 at which the electronic component 511 is disposed, and at least a portion 525-2 of the extension part 525 may be coupled to the second substrate member 502. The extension part 525 may be coupled to the second substrate member 502 in various methods (e.g., coupling by soldering, attachment by a tape, clip coupling, socket coupling, or bolt coupling).

Figure 11C:
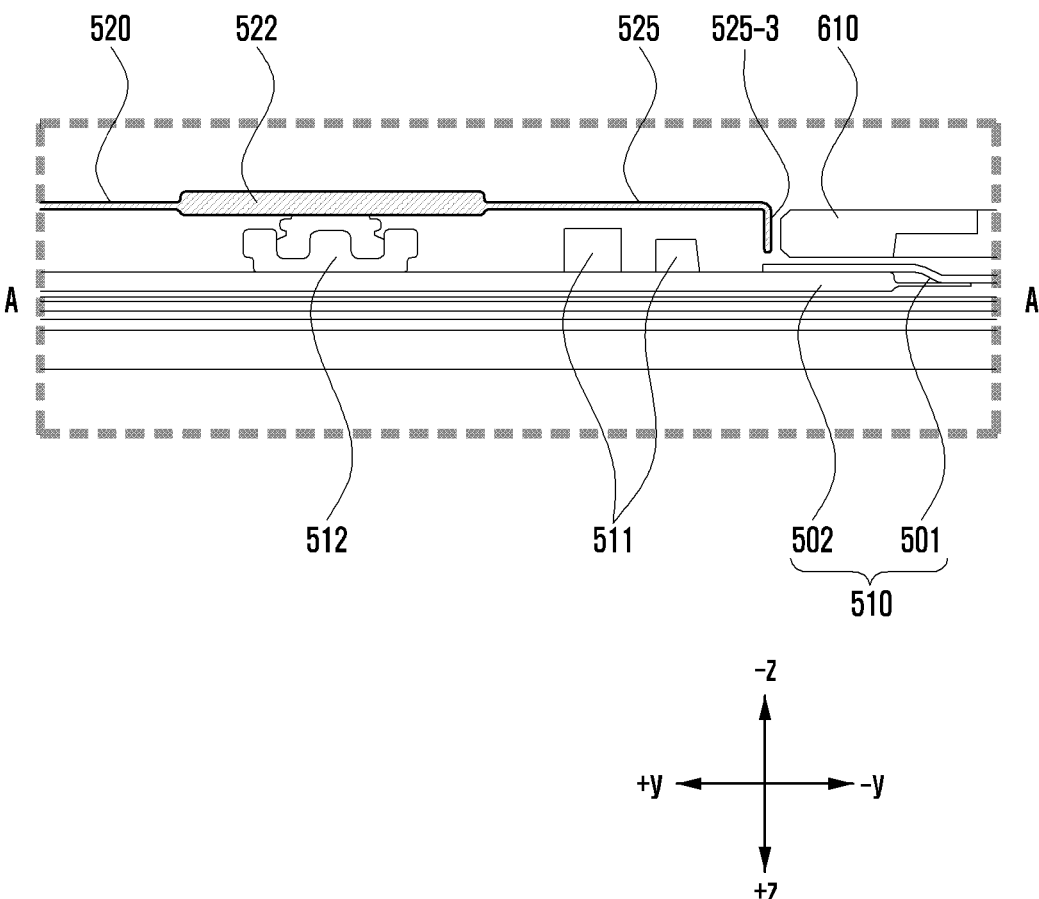

Referring to FIG. 11C, at least a portion 525-3 of the extension part 525 may be bent toward the first substrate member 501.

Figure 11D:
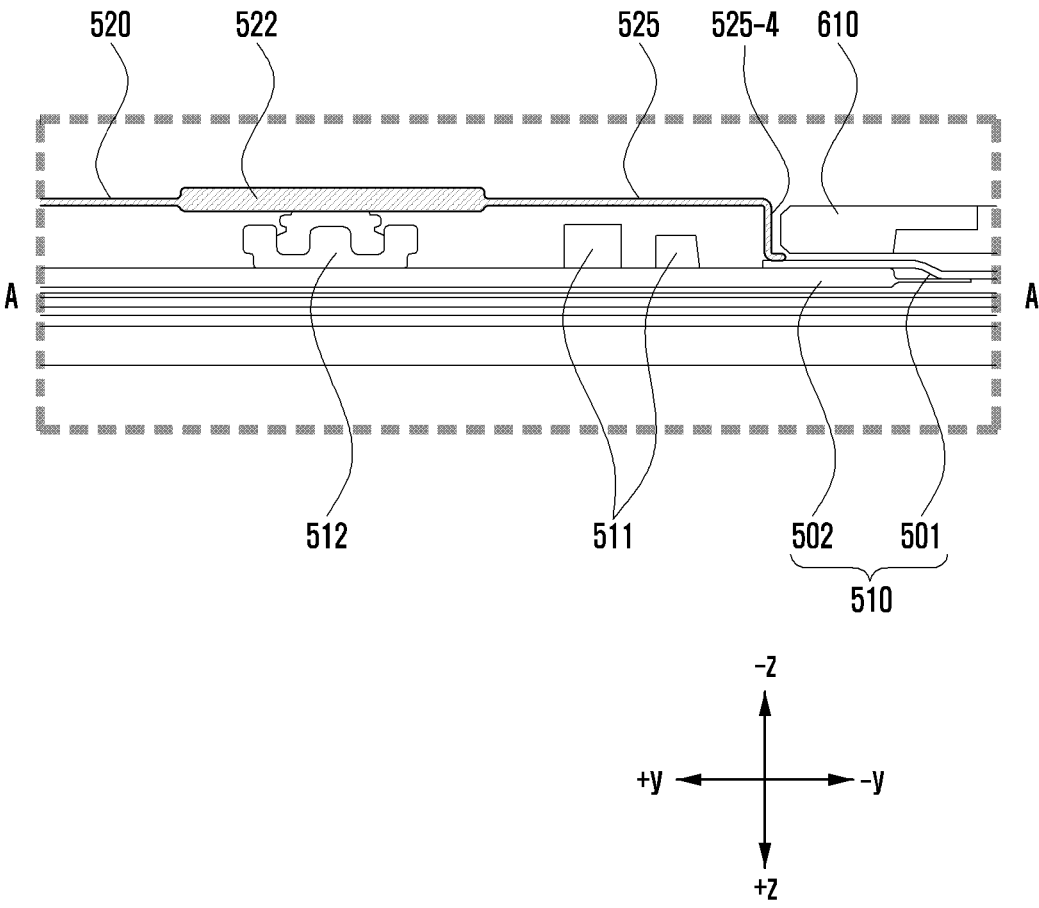

Referring to FIG. 11D, at least a portion 525-4 of the extension part 525 may be bent toward the first substrate member 501, and at least a portion 525-4 of the extension part 525 may be coupled to the first substrate member 501. The extension part 525 may be coupled to the first substrate member 501 in various methods (e.g., coupling by soldering, attachment by a tape, clip coupling, socket coupling, or bolt coupling).

An electronic device (e.g., the electronic device 101 of FIG. 1 or the electronic device 300 of FIG. 3) according to various embodiments disclosed in this document may include a display panel (e.g., the display panel 430 of FIG. 4), a flexible printed circuit board (e.g., the flexible printed circuit board 510 of FIG. 5) electrically connected to the display panel, a first connection part (e.g., the first connection part 512 of FIG. 5) disposed at the flexible printed circuit board, at least one electronic component (e.g., the electronic component 511 of FIG. 5) disposed on the flexible printed circuit board adjacent to the first connection part, and a connecting member (e.g., the connecting member 520 of FIG. 6) including a second connection part (e.g., the second connection part 522 of FIG. 6) coupled to the first connection part to be electrically connected to the flexible printed circuit board, wherein the connecting member may include an extension part (e.g., the extension part 525 of FIG. 7A) formed to cover at least one electronic component disposed at the flexible printed circuit board.

Further, the flexible printed circuit board may include a first substrate member (e.g., the first substrate member 501 of FIG. 7B) connected to the display panel and in which a display driver integrated circuit (IC) (DDI) (e.g., the DDI 432 of FIG. 4) configured to drive the display panel is disposed, and a second substrate member (e.g., the second substrate member 502 of FIG. 7B) electrically connected to the first substrate member and in which the at least one electronic component is disposed.

Further, a DDI configured to drive the display panel may be disposed at a substrate extension part extended from a substrate of the display panel, and the flexible printed circuit board may be electrically connected to the substrate extension part.

Further, the electronic device may further include a front housing (e.g., the front housing 610 of FIG. 7A) disposed to cover at least a portion of the flexible printed circuit board and including a recess (e.g., the recess 611 of FIG. 7A) formed to expose the first connection part and the at least one electronic component in one direction.

Further, at least a portion of the extension part of the connecting member may be extended to be disposed between the front housing and the flexible printed circuit board.

Further, at least a portion of the extension part of the connecting member may be attached to one surface of the front housing.

Further, the connecting member may include conductive layers (e.g., the conductive layers L1, L2, L3, and L4 of FIG. 10A) and adhesive layers (e.g., the adhesive layers S1, S2, and S3 of FIG. 10A) disposed between the conductive layers, and one surface of the connecting member may include a first ground area (e.g., the first ground area 523A of FIG. 10A) in which at least a portion of coating layers (e.g., the coating layers 523 and 524 of FIG. 10A) stacked on the conductive layer is removed so as to expose at least one of the plurality of conductive layers in the extension part.

Further, the conductive layer exposed by the first ground area may be electrically connected to a ground part of the printed circuit board of the electronic device.

Further, the other surface of the connecting member may include a second ground area (e.g., the second ground area 524A of FIG. 10A) in which at least a portion of the coating layer is removed so as to expose at least one of the plurality of conductive layers in the extension part.

Further, the conductive layer exposed by the second ground area may be electrically connected to a ground part of the printed circuit board of the electronic device.

A display module (e.g., the display module 400 of FIG. 4) according to various embodiments disclosed in this document may include a display panel (e.g., the display panel 430 of FIG. 4), a flexible printed circuit board (e.g., the flexible printed circuit board 510 of FIG. 5) electrically connected to the display panel, a first connection part (e.g., the first connection part 512 of FIG. 5) disposed at the flexible printed circuit board, at least one electronic component (e.g., the electronic component 511 of FIG. 5) disposed on the flexible printed circuit board adjacent to the first connection part; and a connecting member (e.g., the connecting member 520 of FIG. 6) including a second connection part (e.g., the second connection part 522 of FIG. 6) coupled to the first connection part to be electrically connected to the flexible printed circuit board, wherein the connecting member may include an extension part (e.g., the extension part 525 of FIG. 7A) formed to cover at least one electronic component disposed at the flexible printed circuit board.

Further, the flexible printed circuit board may include a first substrate member (e.g., the first substrate member 501 of FIG. 7B) connected to the display panel and in which a display driver IC (DDI) (e.g., the DDI 432 of FIG. 4) configured to drive the display panel is disposed, and a second substrate member (e.g., the second substrate member 502 of FIG. 7B) electrically connected to the first substrate member and in which the at least one electronic component is disposed.

Further, a DDI configured to drive the display panel may be disposed at a substrate extension part extended from a substrate of the display panel, and the flexible printed circuit board may be electrically connected to the substrate extension part.

Further, the first connection part and the at least one electronic component may be exposed in one direction through a recess (e.g., the recess 611 of FIG. 7A) formed in a front housing (e.g., the front housing 610 of FIG. 7A) disposed to cover at least a portion of the flexible printed circuit board.

Further, at least a portion of the extension part of the connecting member may be extended to be disposed between the front housing and the flexible printed circuit board.

Further, at least a portion of the extension part of the connecting member may be attached to one surface of the front housing.

Further, the connecting member may include conductive layers (e.g., the conductive layers L1, L2, L3, and L4 of FIG. 10A) and adhesive layers (e.g., the adhesive layers S1, S2, and S3 of FIG. 10A) disposed between the conductive layers, and one surface of the connecting member may include a first ground area (e.g., the first ground area 523A of FIG. 10A) in which at least a portion of coating layers (e.g., the coating layers 523 and 524 of FIG. 10A) stacked on the conductive layer is removed so as to expose at least one of the plurality of conductive layers in the extension part.

Further, the conductive layer exposed by the first ground area may be electrically connected to a ground part of the printed circuit board of the electronic device.

Further, the other surface of the connecting member may include a second ground area (e.g., the second ground area 524A of FIG. 10A) in which at least a portion of the coating layer is removed so as to expose at least one of the plurality of conductive layers in the extension part.

Further, the conductive layer exposed by the second ground area may be electrically connected to a ground part of the printed circuit board of the electronic device.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a display panel;
   a flexible printed circuit board electrically connected to the display panel;
   a first connection part disposed at the flexible printed circuit board;
   at least one electronic component disposed on the flexible printed circuit board adjacent to the first connection part; and
   a connecting member comprising: a second connection part coupled to the first connection part; at least one wiring disposed in one direction of the second connection part and connected to the second connection part; and an extension part disposed in another direction of the second connection part, wherein the extension part is formed to cover the at least one electronic component.

2. The electronic device of claim 1, wherein the flexible printed circuit board comprises:
   a first substrate member connected to the display panel and in which a display driver integrated circuit (IC) (DDI) configured to drive the display panel is disposed; and
   a second substrate member electrically connected to the first substrate member and in which the at least one electronic component is disposed.

3. The electronic device of claim 1,
   wherein a display driver integrated circuit (IC) (DDI) configured to drive the display panel is disposed at a substrate extension part extended from a substrate of the display panel, and
   wherein the flexible printed circuit board is electrically connected to the substrate extension part.

4. The electronic device of claim 1, further comprising:
   a front housing disposed to cover at least a portion of the flexible printed circuit board and including a recess formed to expose the first connection part and the at least one electronic component in one direction.

5. The electronic device of claim 4, wherein at least a portion of the extension part of the connecting member is extended to be disposed between the front housing and the flexible printed circuit board.

6. The electronic device of claim 4, wherein at least a portion of the extension part of the connecting member is attached to one surface of the front housing.

7. The electronic device of claim 1,
   wherein the connecting member comprises conductive layers and adhesive layers disposed between the conductive layers, and
   wherein one surface of the connecting member comprises a first ground area in which at least a portion of a coating layer stacked on the at least one conductive layer of the conductive layers is removed so as to expose the at least one conductive layer of the conductive layers in the extension part.

8. The electronic device of claim 7, wherein the at least one conductive layer exposed by the first ground area is electrically connected to a ground part of a printed circuit board of the electronic device.

9. The electronic device of claim 7, wherein another surface of the connecting member comprises a second ground area in which at least a portion of the coating layer is removed so as to expose at least one of the conductive layers in the extension part.

10. The electronic device of claim 9, wherein the conductive layer exposed by the second ground area is electrically connected to a ground part of a printed circuit board of the electronic device.

11. A display module comprising:
    a display panel;
    a flexible printed circuit board electrically connected to the display panel;
    a first connection part disposed at the flexible printed circuit board;
    at least one electronic component disposed on the flexible printed circuit board adjacent to the first connection part; and
    a connecting member comprising: a second connection part coupled to the first connection part; at least one wiring disposed in one direction of the second connection part and connected to the second connection part;

and an extension part disposed in another direction of the second connection part, wherein the extension part is formed to cover the at least one electronic component.

12. The display module of claim 11, wherein the flexible printed circuit board comprises a first substrate member connected to the display panel and in which a display driver integrated circuit (IC) (DDI) configured to drive the display panel is disposed, and a second substrate member electrically connected to the first substrate member and in which the at least one electronic component is disposed.

13. The display module of claim 11, wherein a display driver integrated circuit (IC) (DDI) configured to drive the display panel is disposed at a substrate extension part extended from a substrate of the display panel, and wherein the flexible printed circuit board is electrically connected to the substrate extension part.

14. The display module of claim 11, wherein the first connection part and the at least one electronic component are exposed in one direction through a recess formed in a front housing disposed to cover at least a portion of the flexible printed circuit board.

15. The display module of claim 14, wherein at least a portion of the extension part of the connecting member is extended to be disposed between the front housing and the flexible printed circuit board.

16. The display module of claim 14, wherein at least a portion of the extension part of the connecting member is attached to one surface of the front housing.

17. The display module of claim 11, wherein the connecting member comprises conductive layers and adhesive layers disposed between the conductive layers, and wherein one surface of the connecting member comprises a first ground area in which at least a portion of a coating layer stacked on the at least one conductive layer of the conductive layers is removed so as to expose the at least one conductive layer of the conductive layers in the extension part.

18. The display module of claim 17, wherein the at least one conductive layer exposed by the first ground area is electrically connected to a ground part of a printed circuit board of the display module.

19. The display module of claim 17, wherein another surface of the connecting member comprises a second ground area in which at least a portion of the coating layer is removed so as to expose at least one of the conductive layers in the extension part.

20. The display module of claim 19, wherein the conductive layer exposed by the second ground area is electrically connected to a ground part of a printed circuit board of the display module.

* * * * *